(12) United States Patent
Yanagita et al.

(10) Patent No.: US 6,376,332 B1
(45) Date of Patent: Apr. 23, 2002

(54) COMPOSITE MEMBER AND SEPARATING METHOD THEREFOR, BONDED SUBSTRATE STACK AND SEPARATING METHOD THEREFOR, TRANSFER METHOD FOR TRANSFER LAYER, AND SOI SUBSTRATE MANUFACTURING METHOD

(75) Inventors: Kazutaka Yanagita; Kazuaki Ohmi; Kiyofumi Sakaguchi, all of Yokohama; Hirokazu Kurisu, Nagoya, all of (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 09/494,851

(22) Filed: Feb. 1, 2000

(30) Foreign Application Priority Data

Feb. 2, 1999  (JP) ............................................ 11-025484

(51) Int. Cl.$^7$ ............................................. H01L 21/301
(52) U.S. Cl. ........................................................ 438/458
(58) Field of Search ................................ 438/455, 458, 438/464

(56) References Cited

U.S. PATENT DOCUMENTS

| | | | | |
|---|---|---|---|---|
| 5,869,386 A | * | 2/1999 | Hamajima | 438/455 |
| 6,140,209 A | * | 10/2000 | Iwane | 438/458 |
| 6,143,628 A | * | 11/2000 | Sato | 438/455 |
| 6,190,937 B1 | * | 2/2001 | Nakagawa | 438/67 |

FOREIGN PATENT DOCUMENTS

| | | |
|---|---|---|
| JP | 5-021338 | 1/1993 |
| JP | 7-302889 | 11/1995 |
| JP | A10-326882 | 12/1998 |

OTHER PUBLICATIONS

Imai et al., *Journal of Crystal Growth*, "Crystalline Quality of Silicon Layer Formed by FIPOS Technology", vol. 63, 547 (1983).
A. Uhlir, *Bell System Technical Journal*, "Electrolytic Shaping of Germanium and Silicon", vol. 35, 333 (1956).
T. Unagami, *Journal of Electrochemical Society*, "Formation Mechanism of Porous Silicon Layer by Anodization in HF Solution", vol. 127, 476.
K. Imai, *Solid State Electronics*, "A New Dielectric Isolation Method Using Porous Silicon", vol. 24, 159 (1981).
R.P. Holmstrom and Y.Y. Chi, "Complete Dielectric Isolation By Highly Selective and Self–Stopping Formation of Oxidized Porous Silicon".
English translation of Nagano et al., *IEICE Technical Report*, "Oxidized Porous Silicon and Its Application", vol. 79, SSD79–9549 (1979).

* cited by examiner

Primary Examiner—John F. Niebling
Assistant Examiner—Stacy Whitmore
(74) Attorney, Agent, or Firm—Morgan & Finnegan, L.L.P.

(57) ABSTRACT

A bonded substrate stack formed by bonding first and second substrates is appropriately separated. A first substrate having a porous layer inside and a single-crystal Si layer and insulating layer on the porous layer is brought into tight contact with a second substrate while shifting their central positions to prepare a bonded substrate stack having a projecting portion at which the outer peripheral edge of the first substrate projects outside that of the second substrate. First, a fluid is ejected to the projecting portion to form a separation start portion, and then, separation is started from the separation start portion while rotating the bonded substrate stack.

56 Claims, 12 Drawing Sheets

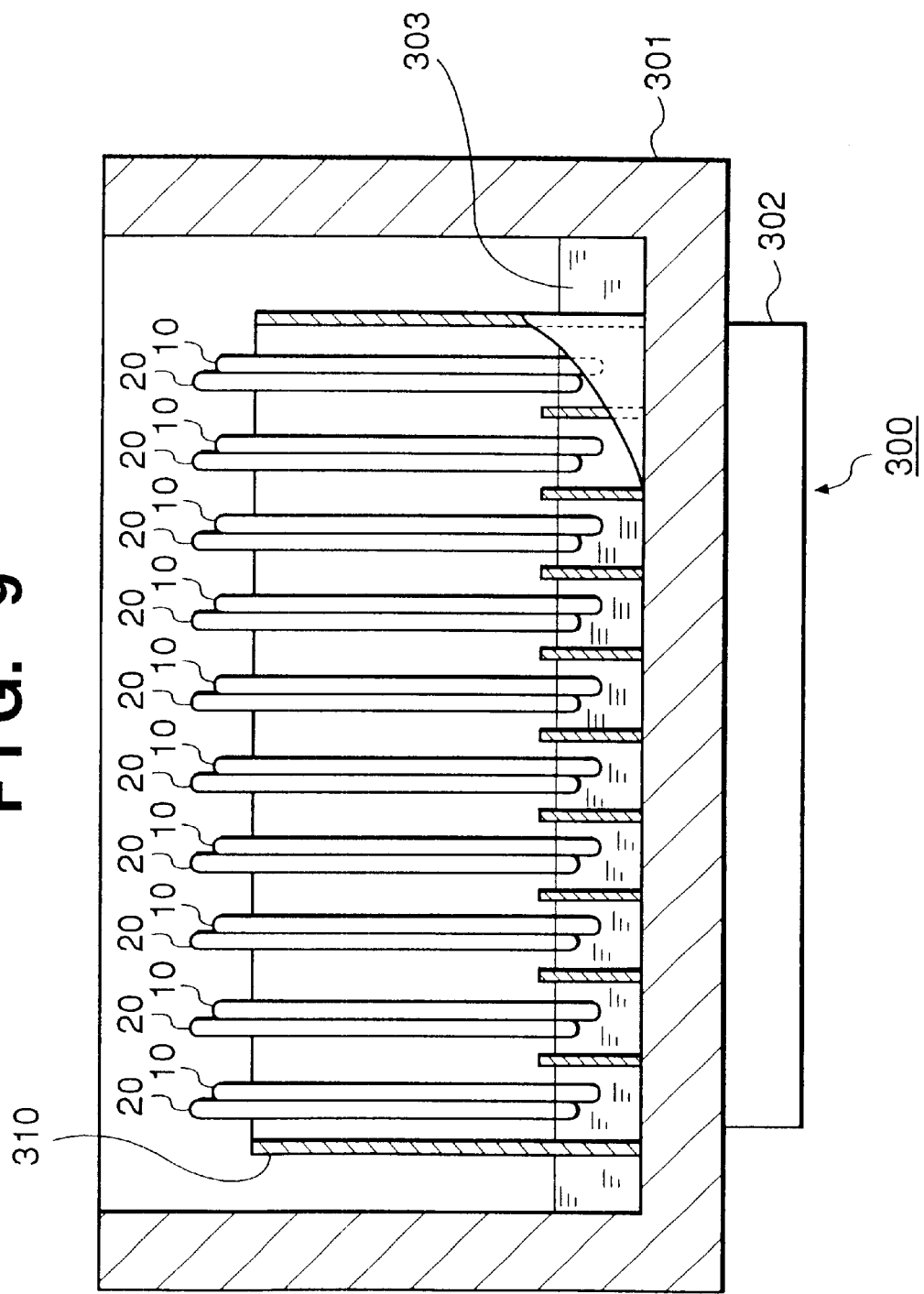

COMPOSITE MEMBER AND SEPARATING METHOD THEREFOR, BONDED SUBSTRATE STACK AND SEPARATING METHOD THEREFOR, TRANSFER METHOD FOR TRANSFER LAYER, AND SOI SUBSTRATE MANUFACTURING METHOD

BACKGROUND OF THE INVENTION

1. Field of the Invention

The present invention relates to a composite member and separating method therefor, a bonded substrate stack and separating method therefor, a transfer method for transfer layer, and an SOI substrate manufacturing method.

2. Description of the Related Art

A substrate (SOI substrate) having an SOI (Silicon On Insulator) structure is known as a substrate having a single-crystal Si layer on an insulating layer. A device using this SOI substrate has many advantages that cannot be achieved by ordinary Si substrates. Examples of the advantages are as follows.

(1) The integration degree can be increased because dielectric isolation is easy.

(2) The radiation resistance can be increased.

(3) The operating speed of the device can be increased because the stray capacitance is small.

(4) No well step is necessary.

(5) Latch-up can be prevented.

(6) A complete depletion type field effect transistor can be formed by thin film formation.

Since an SOI structure has the above various advantages, researches have been made on its formation method for several decades.

As one SOI technology, the SOS (Silicon On Sapphire) technology by which Si is heteroepitaxially grown on a single-crystal sapphire substrate by CVD (Chemical Vapor Deposition) has been known for a long time. This SOS technology once earned a reputation as the most matured SOI technology. However, the SOS technology has not been put into practical use to date because, e.g., a large amount of crystal defects are produced by lattice mismatch in the interface between the Si layer and the underlying sapphire substrate, aluminum that forms the sapphire substrate mixes in the Si layer, the substrate is expensive, and it is difficult to obtain a large area.

Attempts have recently been made to realize the SOI structure without using any sapphire substrate. The attempts are roughly classified into two methods.

In the first method, the surface of a single-crystal Si substrate is oxidized, and a window is formed in the oxide film ($SiO_2$ layer) to partially expose the Si substrate. Single-crystal Si is epitaxially grown laterally using the exposed portion as a seed, thereby forming a single-crystal Si layer on $SiO_2$ (in this method, an Si layer is deposited on an $SiO_2$ layer).

In the second method, a single-crystal Si substrate itself is used as an active layer, and an $SiO_2$ layer is formed on the lower surface of the substrate (in this method, no Si layer is deposited).

As a means for realizing the first method, a method of directly epitaxially growing single-crystal Si in the horizontal direction from the single-crystal Si layer by CVD (CVD), a method of depositing amorphous Si and epitaxially growing single-crystal Si laterally in the solid phase by annealing (solid phase epitaxial growth), a method of irradiating an amorphous silicon layer or a polysilicon layer with a focused energy beam such as an electron beam or laser beam to grow a single-crystal Si layer on an $SiO_2$ layer by melting recrystallization (beam annealing), or a method of scanning band-shaped melting regions by a rod-like heater (zone melting recrystallization) is known.

All of these methods have both advantages and disadvantages and many problems of controllability, productivity, uniformity, and quality, and therefore have not been put into practical use in terms of industrial applications. For example, CVD requires sacrifice oxidation to form a flat thin film. Solid phase epitaxial growth is poor in crystallinity. In beam annealing, the process time required to scan the focused beam and controllability for beam superposition or focal point adjustment pose problems. Zone melting recrystallization is the most matured technique, and relatively large-scaled integrated circuits have been fabricated on a trial basis. However, since a number of crystal defects such as a subboundary undesirably remain, minority carrier devices cannot be created.

As the above second method, i.e., as the method without using the Si substrate as a seed for epitaxial growth, the following four techniques can be used.

As the first technique, an oxide film is formed on a single-crystal Si substrate having a V-shaped groove formed in the surface by anisotropic etching. A polysilicon layer having nearly the same thickness as that of the single-crystal Si substrate is deposited on the oxide film. After this, the single-crystal Si substrate is polished from the lower surface, thereby forming, on the thick polysilicon layer, a substrate having a single-crystal Si region surrounded and dielectrically isolated by the V-shaped groove. With this technique, a substrate having satisfactory crystallinity can be formed. However, there are problems of controllability and productivity in association with the process of depositing polysilicon as thick as several hundred micron or the process of polishing the single-crystal Si substrate from the lower surface to leave the isolated Si active layer.

The second technique is SIMOX (Separation by Ion Implanted Oxygen). In this technique, oxygen ions are implanted into a single-crystal Si substrate to form an $SiO_2$ layer. In this technique, to form an $SiO_2$ layer in a substrate, oxygen ions must be implanted at a dose of $10^{18}$ (ions/cm$^2$) or more. This implantation takes a long time to result in low productivity and high manufacturing cost. In addition, since a number of crystal defects are generated, the quality is too low to manufacture minority carrier devices.

As the third technique, an SOI structure is formed by dielectric isolation by oxidizing a porous Si layer. In this technique, an n-type Si island is formed on the surface of a p-type single-crystal Si substrate by proton ion implantation (Imai et al., J. Crystal Growth, vol. 63, 547 (1983)) or epitaxial growth and patterning. This substrate is anodized in an HF solution to convert only the p-type Si substrate around the n-type Si island into a porous structure. After this, the n-type Si island is dielectrically isolated by accelerated oxidation. In this technique, since the Si region to be isolated must be determined before the device process, the degree of freedom in device design is limited.

As the fourth technique, an SOI structure is formed by bonding a single-crystal Si substrate to another thermally oxidized single-crystal Si substrate by annealing or an adhesive. In this technique, an active layer for forming a device must be uniformly thin. More specifically, a single-crystal Si substrate having a thickness of several hundred micron must be thinned down to the micron order or less.

To thin the substrate, polishing or selective etching can be used.

A single-crystal Si substrate can hardly be uniformly thinned by polishing. Especially, in thinning to the submicron order, the variation range is several ten %. As the wafer size becomes large, this difficulty becomes more pronounced.

Selective etching is effective to uniformly thin the substrate. However, the selectivity ratio is as low as about $10^2$, the surface planarity after etching is poor, and the crystallinity of the SOI layer is unsatisfactory.

A transparent substrate represented by a glass substrate is important in forming a contact sensor as a light-receiving element or a projection liquid crystal display device. To realize highly precise pixels (picture elements) having higher density and resolution for the sensor or display device, a high-performance driving element is required. For this purpose, a demand has arisen for a technique of forming a single-crystal Si layer having excellent crystallinity on a transparent substrate.

However, when an Si layer is deposited on a transparent substrate represented by a glass substrate, only an amorphous Si layer or a polysilicon layer is obtained. This is because the transparent substrate has an amorphous crystal structure, and the Si layer formed on the substrate reflects the disorderliness of the crystal structure of the transparent substrate.

The present applicant has disclosed a new SOI technology in Japanese Patent Laid-Open No. 5-21338. In this technique, a first substrate obtained by forming a porous layer on a single-crystal Si substrate and a non-porous single-crystal layer on its surface is bonded to a second substrate via an insulating layer. After this, the bonded substrate stack is separated into two substrates at the porous layer, thereby transferring the non-porous single-crystal layer to the second substrate. This technique is advantageous because the film thickness uniformity of the SOI layer is good, the crystal defect density in the SOI layer can be decreased, the surface planarity of the SOI layer is good, no expensive manufacturing apparatus with special specifications is required, and SOI substrates having about several hundred-Å to 10-μm thick SOI films can be manufactured by a single manufacturing apparatus.

The present applicant has also disclosed, in Japanese Patent Laid-Open No. 7-302889, a technique of bonding first and second substrates, separating the first substrate from the second substrate without breaking the first substrate, smoothing the surface of the separated first substrate, forming a porous layer again on the first substrate, and reusing this substrate. Since the first substrate is not wasted, this technique is advantageous in largely reducing the manufacturing cost and simplifying the manufacturing process.

To separate the bonded substrate stack into two substrates without breaking the first and second substrates, for example, the two substrates are pulled in opposite directions while applying a force in a direction perpendicular to the bonding interface, a shearing force is applied parallel to the bonding interface (for example, the two substrates are moved in opposite directions in a plane parallel to the bonding interface, or the two substrates are rotated in opposite directions while applying a force in the circumferential direction), a pressure is applied in a direction perpendicular to the bonding interface, a wave energy such as an ultrasonic wave is applied to the separation region, a peeling member (e.g., a sharp blade such as knife) is inserted into the separation region parallel to the bonding interface from the side surface of the bonded substrate stack, the expansion energy of a substance filling the pores of the porous layer functioning as the separation region is used, the porous layer functioning as the separation region is thermally oxidized from the side surface of the bonded substrate stack to expand the volume of the porous layer and separate the substrates, or the porous layer functioning as the separation region is selectively etched from the side surface of the bonded substrate stack to separate the substrate.

Porous Si was found in 1956 by Uhlir et al. who were studying electropolishing of semiconductors (A. Uhlir, Bell Syst. Tech. J., vol. 35, 333 (1956)). Porous Si can be formed by anodizing an Si substrate in an HF solution.

Unagami et al. studied the dissolution reaction of Si upon anodizing and reported that holes were necessary for anodizing reaction of Si in an HF solution, and the reaction was as follows (T. Unagami, J. Electrochem. Soc., vol. 127, 476 (1980)).

$$Si + 2HF + (2-n)e^+ \rightarrow SiF_2 + 2H^+ ne^-$$

$$SiF_2 + 2HF \rightarrow SiF_4 + H_2$$

$$SiF_4 + 2HF \rightarrow H_2SiF_6$$

or $$Si + 4HF + (4-\lambda)e^+ \rightarrow SiF_4 + 4H^+ \lambda e^-$$

$$SiF_4 + 2HF \rightarrow H_2SiF_6$$

where $e^+$ and $e^-$ represent a hole and an electron, respectively, and n and λ are the number of holes necessary to dissolve one Si atom. According to them, when n>2 or λ>4, porous Si is formed.

The above fact suggests that p-type Si having holes is converted into porous Si while n-type Si is not converted. The selectivity in this conversion has been reported by Nagano et al. and Imai (Nagano, Nakajima, Anno, Onaka, and Kajiwara, IEICE Technical Report, vol. 79, SSD79-9549 (1979)), (K. Imai, Solid-State Electronics, vol. 24, 159 (1981)).

However, it has also been reported that n-type at a high concentration is converted into porous Si (R. P. Holmstrom and J. Y. Chi, Appl. Phys. Lett., vol. 42, 386 (1983)). Hence, it is important to select a substrate which can be converted into a porous Si substrate independently of p- or n-type.

To form a porous layer, in addition to anodization, ions may be implanted into a silicon substrate.

For example, in the method described in Japanese Patent Laid-Open No. 5-21338, i.e., the method in which a substrate (to be referred to as a bonded substrate stack hereinafter) obtained by bonding a first substrate having a non-porous layer such as a single-crystal Si layer on a porous layer to a second substrate via an insulating layer is separated at the porous layer, thereby transferring the non-porous layer formed on the first substrate side to the second substrate, the technique of separating the bonded substrate stack is very important.

For example, in separating the bonded substrate stack, if it is separated at a portion except the porous layer as the separation layer, the non-porous layer (e.g., a single-crystal Si layer) to be used as an active layer is broken, and no desired SOI substrate can be obtained.

SUMMARY OF THE INVENTION

The present invention has been made in consideration of the above situation, and has as its object to make it possible to appropriately separate a composite member such as a bonded substrate stack at a separation layer such as a porous layer.

According to the first aspect of the present invention, there is provided a method of separating a composite member having a structure in which a first member having a separation layer inside is brought into tight contact with a second member, characterized in that the composite member has a projecting portion at which an outer peripheral edge of the first member projects outside that of the second member, and the method comprises the separation step of starting separating the composite member from the projecting portion and then separating the composite member into two members at the separation layer.

In the composite member separating method according to the first aspect of the present invention, preferably, for example, a major surface of the first member has the same shape as that of the second member, and the composite member has a structure in which the major surface of the first member is brought into tight contact with the major surface of the second member while shifting central positions from each other.

In the composite member separating method according to the first aspect of the present invention, preferably, for example, a major surface of the second member is smaller than that of the first member, and the composite member has a structure in which the major surface of the first member is brought into tight contact with the major surface of the second member.

In the composite member separating method according to the first aspect of the present, invention, for example, the separation step preferably comprises the pre-separation step of processing the projecting portion to form a separation start portion, and the main separation step of starting separating the composite member from the separation start portion and then breaking substantially only the separation layer to separate the composite member into two members at the separation layer.

According to the second aspect of the present invention, there is provided a composite member manufacturing method characterized by comprising bringing a first member having a separation layer inside into tight contact with a second member to manufacture a composite member having a projecting portion at which an outer peripheral edge of the first member projects outside that of the second member.

According to the third aspect of the present invention, there is provided a method of transferring a transfer layer on a surface of a first member to a second member, characterized by comprising the preparation step of bringing a first member having a separation layer inside and the transfer layer on the separation layer into tight contact with a second member to prepare a composite member in which an outer peripheral edge of the first member projects outside that of the second member, and the separation step for starting separating the composite member from the projecting portion and separating the composite member into two members at the separation layer, thereby transferring the transfer layer of the first member to the second member.

According to the fourth aspect of the present invention, there is provided a separating method of separating into two substrates a bonded substrate stack having a structure formed by bringing a transfer layer of a first substrate having a separation layer inside and the transfer layer on the separation layer into tight contact with a second substrate, characterized in that the bonded substrate stack has a projecting portion at which an outer peripheral edge of the first substrate projects outside that of the second substrate, and the separation method comprises the separation step of starting separating the bonded substrate stack from the projecting portion and then separating the bonded substrate stack into two substrates at the separation layer.

In the bonded substrate stack separating method according to the fourth aspect of the present invention, preferably, for example, the first substrate has the same size as that of the second substrate, and the bonded substrate stack has a structure in which the first substrate and the second substrate are brought into tight contact while shifting central positions from each other.

In the bonded substrate stack separating method according to the fifth aspect of the present invention, for example, the bonded substrate stack preferably has a structure in which the first substrate is brought into tight contact with the second substrate smaller than the first substrate.

In the bonded substrate stack separating method according to the fifth aspect of the present invention, preferably, for example, the second substrate has one of an orientation flat and a notch, and the bonded substrate stack has, as the projecting portion, a portion where the first substrate is exposed in the presence of the orientation flat or notch of the second substrate.

In the bonded substrate stack separating method according to the fifth aspect of the present invention, preferably, for example, each of the first substrate and the second substrate has one of an orientation flat and a notch, and the bonded substrate stack is formed by bringing the first substrate and the second substrate into tight contact with each other without matching the orientation flat or notch of the first substrate with the orientation flat or notch of the second substrate, and has, as the projecting portion, a portion where the first substrate is exposed in the presence of the orientation flat or notch of the second substrate.

According to the sixth aspect of the present invention, there is provided a bonded substrate stack manufacturing method characterized by comprising bonding a transfer layer of a first substrate having a separation layer inside and the transfer layer on the separation layer to a second substrate to manufacture a bonded substrate stack having a projecting portion at which an outer peripheral edge of the first substrate projects outside that of the second substrate.

According to the seventh aspect of the present invention, there is provided a transfer method of transferring a transfer layer on a surface of a first substrate to a second substrate, characterized by comprising the preparation step of bonding the transfer layer of the first substrate having a separation layer inside and the transfer layer on the separation layer to the second substrate to prepare a bonded substrate stack having a projecting portion at which an outer peripheral edge of the first substrate projects outside that of the second substrate, and the separation step of starting separating the bonded substrate stack from the projecting portion and then separating the bonded substrate stack at the separation layer, thereby transferring the transfer layer of the first substrate to the second substrate.

In the transfer layer transfer method according to the seventh aspect of the present invention, for example, the preparation step preferably comprises bringing the first substrate and the second substrate, which have the same size, into tight contact with,each other while shifting central positions to prepare the bonded substrate stack.

In the transfer layer transfer method according to the seventh aspect of the present invention, for example, the preparation step preferably comprises bringing the first substrate into tight contact with the second substrate smaller than the first substrate to prepare the bonded substrate stack.

In the transfer layer transfer method according to the seventh aspect of the present invention, for example, the preparation step preferably comprises bringing the first substrate into tight contact with the second substrate having one of an orientation flat and a notch to prepare the bonded substrate stack having, as the projecting portion, a portion where the first substrate is exposed in the presence of the orientation flat or notch of the second substrate.

In the transfer layer transfer method according to the seventh aspect of the present invention, for example, the preparation step preferably comprises preparing the first substrate and the second substrate each having one of an orientation flat and a notch, and bringing the first substrate and the second substrate into tight contact with each other without matching the orientation flat or notch of the first substrate with the orientation flat or notch of the second substrate to prepare the bonded substrate stack.

In the transfer layer transfer method according to the seventh aspect of the present invention, for example, the separation step preferably comprises the pre-separation step of processing the projecting portion to form a separation start portion and starting separating the bonded substrate stack from the separation start portion and then breaking substantially only the separation layer to separate the bonded substrate stack into two substrates at the separation layer.

In the transfer layer transfer method according to the seventh aspect of the present invention, for example, the pre-separation step preferably comprises ejecting a fluid to the projecting portion to form the separation start portion by the fluid.

In the transfer layer transfer method according to the seventh aspect of the present invention, for example, the pre-separation step preferably comprises inserting a wedge-shaped member into a gap between the first substrate and the second substrate at the projecting portion to form the separation start portion.

In the transfer layer transfer method according to the seventh aspect of the present invention, for example, the pre-separation step preferably comprises supplying a vibration energy to the projecting portion to form the separation start portion.

In the transfer layer transfer method according to the seventh aspect of the present invention, for example, the pre-separation step preferably comprises dipping the projecting portion in a liquid and supplying a vibration energy to the projecting portion through the liquid to form the separation start portion.

In the transfer layer transfer method according to the seventh aspect of the present invention, for example, water is preferably used as the liquid.

In the transfer layer transfer method according to the seventh aspect of the present invention, for example, an etchant is preferably used as the liquid.

In the transfer layer transfer method according to the seventh aspect of the present invention, for example, the pre-separation step preferably comprises etching the transfer layer and the separation layer at the projecting portion to form the separation start portion.

In the transfer layer transfer method according to the seventh aspect of the present invention, for example, the separation step preferably comprises ejecting a fluid to the projecting portion to form the separation start portion on the bonded substrate stack and continuing separating the bonded substrate stack while changing a position where the fluid is injected.

In the transfer layer transfer method according to the seventh aspect of the present invention, for example, the separation step preferably comprises inserting a wedge-shaped member into a gap between the first substrate and the second substrate at the projecting portion to separate the bonded substrate stack.

In the transfer layer transfer method according to the seventh aspect of the present invention, for example, the separation start portion is preferably a portion where the separation layer at the portion has the most fragile structure.

In the transfer layer transfer method according to the seventh aspect of the present invention, for example, the separation start portion is preferably a portion where the transfer layer at the portion is removed, and the separation layer under the transfer layer is exposed.

In the transfer layer transfer method according to the seventh aspect of the present invention, for example, the separation start portion is preferably a portion where the separation layer at the portion is exposed, and an outer peripheral edge of the separation layer is located inside the bonded substrate stack.

In the transfer layer transfer method according to the seventh aspect of the present invention, for example, the separation layer is preferably a porous layer.

In the transfer layer transfer method according to the seventh aspect of the present invention, for example, the first substrate is preferably a substrate formed by anodizing a substrate to form a porous layer as the separation layer and forming the transfer layer on the separation layer.

In the transfer layer transfer method according to the seventh aspect of the present invention, for example, the first substrate preferably has, as the separation layer, a porous layer formed by ion implantation.

In the transfer layer transfer method according to the seventh aspect of the present invention, for example, the transfer layer preferably includes a single-crystal Si layer.

In the transfer layer transfer method according to the seventh aspect of the present invention, for example, the transfer layer preferably sequentially has a single-crystal Si layer and an insulating layer as the transfer layer.

According to the eighth aspect of the present invention, there is provided a method of manufacturing an SOI substrate, characterized by comprising the preparation step of bringing a surface of a first substrate having a porous layer inside and a transfer layer including a single-crystal Si layer on the porous layer into tight contact with a second substrate to prepare a bonded substrate stack having a projecting portion at which an outer peripheral edge of the first substrate projects outside that of the second substrate, the separation step for starting separating the bonded substrate stack from the projecting portion and separating the bonded substrate stack at the porous layer, thereby transferring the transfer layer of the first substrate to the second substrate, and the removal step of removing the porous layer remaining on a surface of the second substrate after separation.

In the SOI substrate manufacturing method according to the eighth aspect of the present invention, for example, the first substrate preferably has, as the transfer layer, not only the single-crystal Si layer but also an insulating layer on the single-crystal Si layer.

In the SOI substrate manufacturing method according to the eighth aspect of the present invention, for example, the second substrate preferably has an insulating layer on a surface.

In the SOI substrate manufacturing method according to the eighth aspect of the present invention, for example, the preparation step preferably comprises bringing the first substrate and the second substrate, which have the same size, into tight contact with each other while shifting central positions to prepare the bonded substrate stack.

In the SOI substrate manufacturing method according to the eighth aspect of the present invention, for example, the preparation step preferably comprises bringing the first substrate into tight contact with the second substrate smaller than the first substrate to prepare the bonded substrate stack.

In the SOI substrate manufacturing method according to the eighth aspect of the present invention, for example, the preparation step preferably comprises bringing the first substrate into tight contact with the second substrate while making the central positions match with each other.

In the SOI substrate manufacturing method according to the eighth aspect of the present invention, for example, the preparation step preferably comprises bringing the first substrate into tight contact with the second substrate having one of an orientation flat and a notch to prepare the bonded substrate stack having, as the projecting portion, a portion where the first substrate is exposed in the presence of the orientation flat or notch of the second substrate.

In the SOI substrate manufacturing method according to the eighth aspect of the present invention, for example, the preparation step preferably comprises preparing the first substrate and the second substrate each having one of an orientation flat and a notch, and bringing the first substrate and the second substrate into tight contact with each other without matching the orientation flat or notch of the first substrate with the orientation flat or notch of the second substrate to prepare the bonded substrate stack.

In the SOI substrate manufacturing method according to the eighth aspect of the present invention, for example, the separation step preferably comprises the pre-separation step of processing the projecting portion to form a separation start portion, and starting separating the bonded substrate stack from the separation start portion and then breaking substantially only the porous layer to separate the bonded substrate stack into two substrates at the porous layer.

In the SOI substrate manufacturing method according to the eighth aspect of the present invention, for example, the pre-separation step preferably comprises ejecting a fluid to the projecting portion to form the separation start portion by the fluid.

In the SOI substrate manufacturing method according to the eighth aspect of the present invention, for example, the pre-separation step preferably comprises inserting a wedge-shaped member into a gap between the first substrate and the second substrate at the projecting portion to form the separation start portion.

In the SOI substrate manufacturing method according to the eighth aspect of the present invention, for example, the pre-separation step preferably comprises supplying a vibration energy to the projecting portion to form the separation start portion.

In the SOI substrate manufacturing method according to the eighth aspect of the present invention, for example, the pre-separation step preferably comprises dipping the projecting portion in a liquid and supplying a vibration energy to the projecting portion through the liquid to form the separation start portion.

In the SOI substrate manufacturing method according to the eighth aspect of the present invention, for example, water is preferably used as the liquid.

In the SOI substrate manufacturing method according to the eighth aspect of the present invention, for example, an etchant is preferably used as the liquid.

In the SOI substrate manufacturing method according to the eighth aspect of the present invention, for example, the pre-separation step preferably comprises etching the transfer layer and the porous layer at the projecting portion to form the separation start portion.

In the SOI substrate manufacturing method according to the eighth aspect of the present invention, for example, the separation step preferably comprises ejecting a fluid to the projecting portion to form the separation start portion on the bonded substrate stack and continuing separating the bonded substrate stack while changing a position where the fluid is injected.

In the SOI substrate manufacturing method according to the eighth aspect of the present invention, for example, the separation step preferably comprises inserting a wedge-shaped member into a gap between the first substrate and the second substrate at the projecting portion to separate the bonded substrate stack.

In the SOI substrate manufacturing method according to the eighth aspect of the present invention, for example, the separation start portion is preferably a portion where the porous layer at the portion has the most fragile structure.

In the SOI substrate manufacturing method according to the eighth aspect of the present invention, for example, the separation start portion is preferably a portion where the transfer layer at the portion is removed, and the porous layer under the transfer layer is exposed.

In the SOI substrate manufacturing method according to the eighth aspect of the present invention, for example, the separation start portion is preferably a portion where the porous layer at the portion is exposed, and an outer peripheral edge of the porous layer is located inside the bonded substrate stack.

According to the ninth aspect of the present invention, there is provided a composite member having a structure in which a first member having a separation layer inside is brought into tight contact with a second member, characterized by comprising a projecting portion at which an outer peripheral edge of the first member projects outside that of the second member.

According to the 10th aspect of the present invention, there is provided a bonded substrate stack having a structure in which a first substrate having a separation layer inside and a transfer layer on the separation layer is brought into tight contact with a second substrate, characterized by comprising a projecting portion at which an outer peripheral edge of the first substrate projects outside that of the second substrate.

According to the 11th aspect of the present invention, there is provided a bonded substrate stack formed by bonding a surface of a first substrate having a porous layer inside and a transfer layer including a single-crystal Si layer on the porous layer to a second substrate, characterized by comprising a projecting portion at which an outer peripheral edge of the first substrate projects outside that of the second substrate.

Further objects, features and advantages of the present invention will become apparent from the following detailed description of the embodiments of the present invention with reference to the accompanying drawings.

BRIEF DESCRIPTION OF THE DRAWINGS

FIG. 9 is a view showing the schematic arrangement of a processing apparatus according to still another preferred embodiment of the present invention.

DETAILED DESCRIPTION OF THE PREFERRED EMBODIMENTS

Preferred embodiments of the present invention will be described below with reference to the accompanying drawings.

FIGS. 1A to 1E are schematic views for explaining a method of manufacturing an SOI substrate according to a preferred embodiment of the present invention.

Figure 1A:
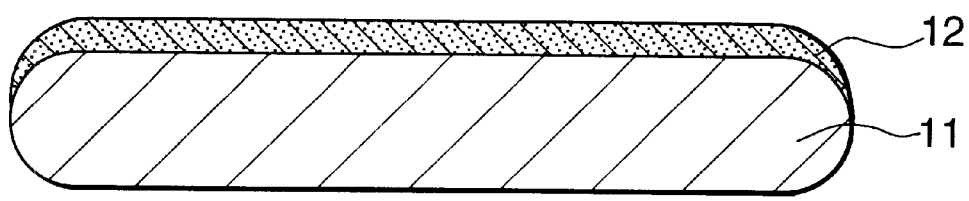
FIG. 1A is a schematic view for explaining the step of forming a porous layer in a method of manufacturing an SOI substrate according to a preferred embodiment of the present invention.

In the step shown in FIG. 1A, a single-crystal Si substrate 11 is prepared, and a porous Si layer 12 is formed on the surface of the single-crystal Si substrate 11 by, e.g., anodizing.

Figure 1B:
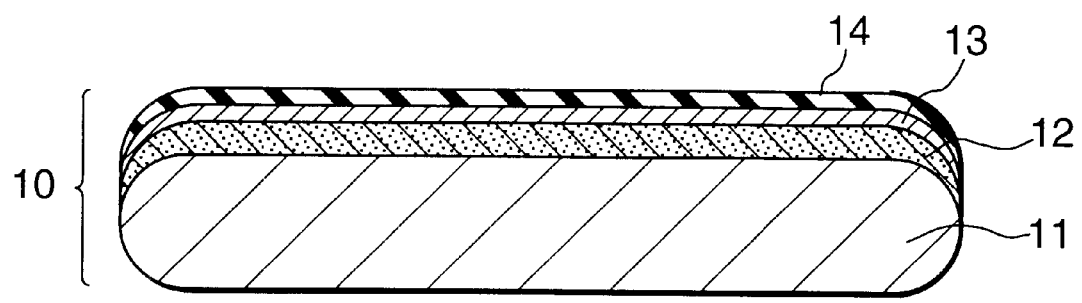
FIG. 1B is a schematic view for explaining the step of forming a single-crystal Si layer and insulating layer in the method of manufacturing the SOI substrate according to the preferred embodiment of the present invention.

In the step shown in FIG. 1B, a non-porous single-crystal Si layer 13 is formed on the porous Si layer 12 by epitaxial growth. The surface of the non-porous single-crystal Si layer 13 is oxidized to form an insulating layer ($SiO_2$) layer 14. With this process, a first substrate 10 is formed.

The porous Si layer 12 may be formed by, e.g., a method of implanting ions of hydrogen, helium, or an inert gas into the single-crystal Si substrate 11 (ion implantation). The porous Si layer formed by this method has a number of microcavities and is therefore called a microcavity layer.

Figure 1C:
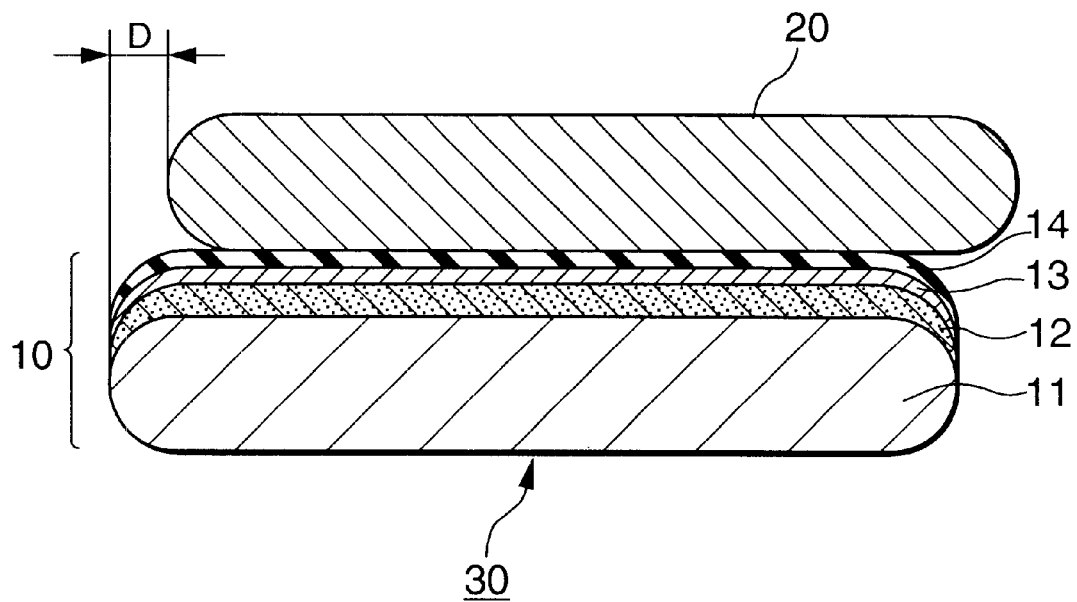
FIG. 1C is a schematic view for explaining the bonding step in the method of manufacturing the SOI substrate according to the preferred embodiment of the present invention.

In the step shown in FIG. 1C, a second substrate 20 of single-crystal Si is prepared and brought into tight contact with the first substrate 10 at room temperature while making the insulating layer 14 oppose the second substrate 20, thereby forming a bonded substrate stack.

In the preferred embodiment of the present invention, a bonded substrate stack 30 is formed. The bonded substrate stack 30 has a portion (to be referred to as a projecting portion hereinafter) where the outer peripheral edge of the first substrate which has the porous layer 12 as a layer for separation (separation layer) is partially located outside that of the second substrate 20. To form this bonded substrate stack 30, for example, the following methods are preferably used.

(1) The first substrate 10 is brought into tight contact with the second substrate 20 which has the same size as that of the first substrate while shifting the central positions of the substrates.

(2) The first substrate 10 is brought into tight contact with the second substrate 20 smaller than the first substrate 10.

(3) A substrate having a notch or an orientation flat is employed as the second substrate 20. The surface of the first substrate 10 is exposed at the notch or orientation flat portion of the second substrate. In this case, at the notch or orientation flat portion of the second substrate 20, the outer peripheral edge of the first substrate 10 projects outward from the outer peripheral edge of the second substrate 20.

(4) After the first substrate 10 and second substrate 20 are bonded, the outer peripheral portion of the second substrate is partially or entirely ground.

In the method (3), when a substrate having a notch or an orientation flat is employed as the first substrate 10, too, the substrates are stacked such that the notch or orientation flat of the first substrate 10 does not correspond with the notch or orientation flat of the second substrate 20.

FIG. 1C schematically shows an example in which the method of bringing the first substrate 10 and second substrate 20, which have the same size, into tight contact with each other while shifting their central positions. A projection amount D of the part of the first substrate 10 need be, e.g., only about 0.1 to 0.5 mm, and may be larger.

Figure 2:
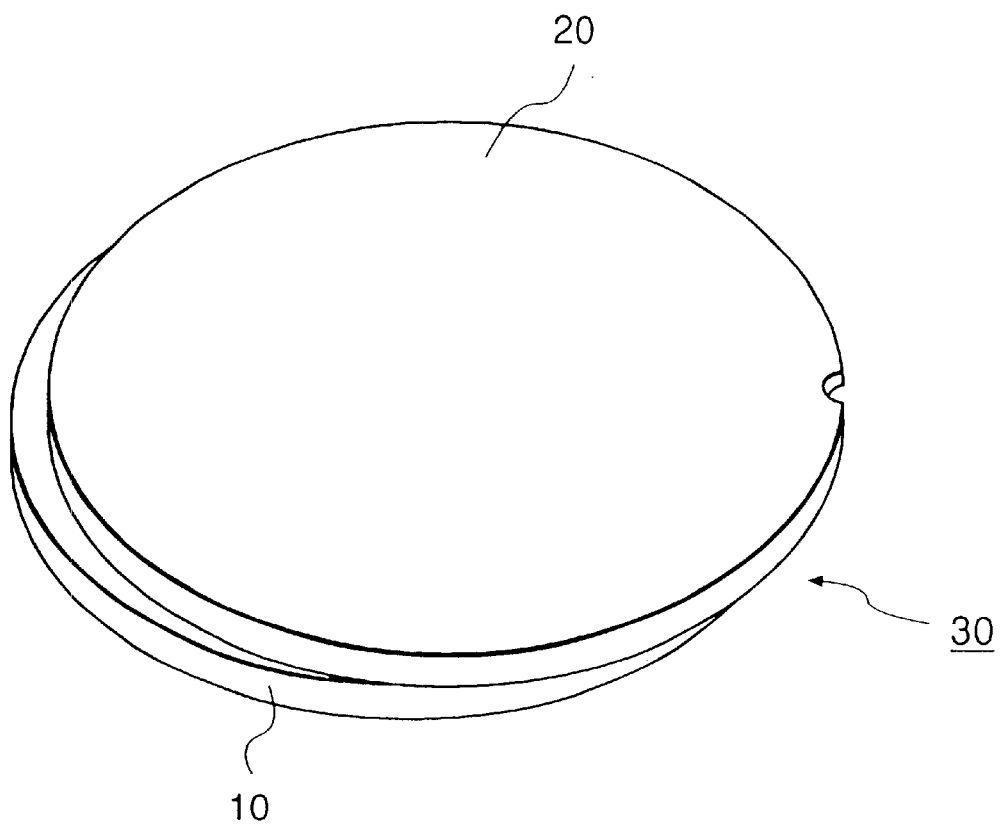
FIG. 2 is a perspective view showing an example of a bonded substrate stack having a projecting portion formed by bonding first and second substrates whose central positions are shifted.
Figure 5:
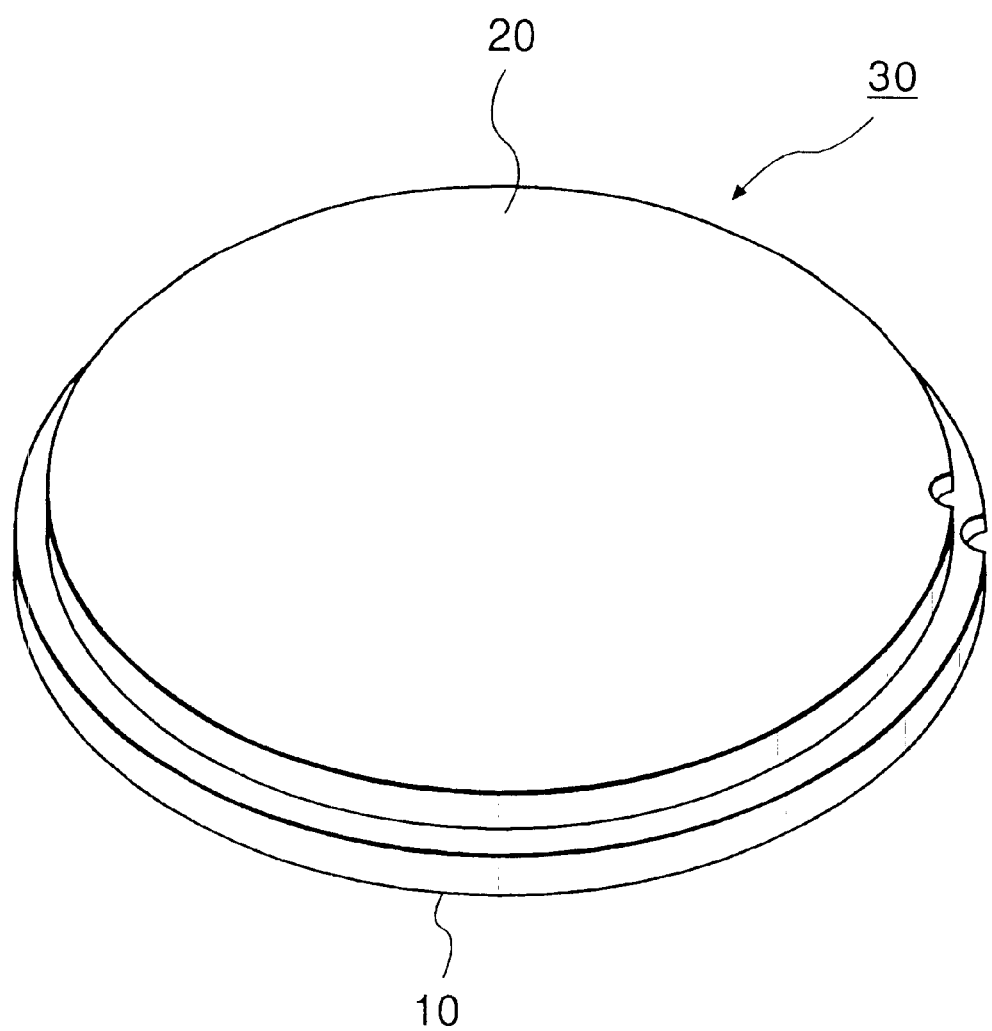
FIG. 5 is a view showing an example of a bonded substrate stack having a projecting portion formed by bringing a first substrate and a second substrate smaller than the first substrate into tight contact with each other.

FIG. 2 is a perspective view schematically showing an example of the bonded substrate stack 30 shown in FIG. 1C. FIG. 5 is a perspective view showing an example of the bonded substrate stack 30 formed by bringing the first substrate 10 and the second substrate 20 smaller than the first substrate 10 into tight contact with each other while making their central positions match.

The insulating layer 14 may be formed on the single-crystal Si layer 13 side, on the second substrate 20, or on both single-crystal Si layer 13 and second substrate 20 as far as the state shown in FIG. 1C is obtained upon bringing the first and second substrates into tight contact with each other. However, when the insulating layer 14 is formed on the side of the single-crystal Si layer 13 serving as an active layer, an SOI substrate having a higher quality can be obtained. This is because the bonding interface between the first substrate 10 and the second substrate 20 can be apart from the active layer.

Figure 1D:
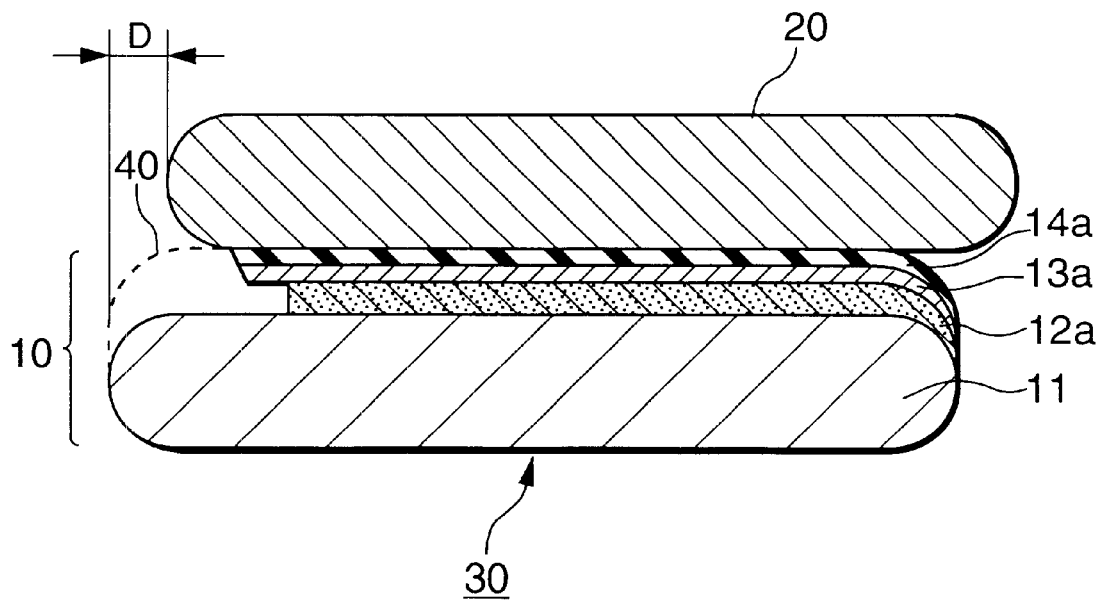
FIG. 1D is a schematic view for explaining the step of forming a separation start region (pre-separation step) in the method of manufacturing the SOI substrate according to the preferred embodiment of the present invention.

In the step shown in FIG. 1D, a separation start portion 40 as a portion where separation starts is formed at the projecting portion. More specifically, at least a part of the transfer layer (single-crystal Si layer 13 and insulating layer 14) in a region of the projecting portion of the first substrate 10 is removed, and the porous layer under the transfer layer can be optionally removed, to form the separation start portion 40. To form the separation start portion 40, for example, the following methods are preferably used.

(1) A fluid is ejected to the projecting portion to break and remove the transfer layer and underlying porous layer 12 at that portion.

(2) A wedge is inserted near the bonding interface (bonding interface between the first substrate 10 and the second substrate 20) at the projecting portion, thereby breaking and removing the transfer layer and underlying porous layer 12.

(3) A vibration energy such as an ultrasonic wave is applied to the projecting portion to break the porous layer 12 at that portion and peel the transfer layer on the porous layer 12.

(4) The projecting portion is dipped in an etchant, and the transfer layer and underlying porous layer 12 are moved by etching.

Referring to FIG. 1D, reference numeral 12a denotes a porous layer after formation of the separation start portion 40; 13a, a single-crystal Si layer after formation of the separation start portion 40; and 14a, an insulating layer after formation of the separation start portion 40.

The separation start portion 40 preferably has a structure that allows only the porous layer 12 to break to separate the bonded substrate stack into two substrates in the subsequent separation step. Alternatively, the separation start portion 40 is preferably a portion where the porous layer 12 is mechanically more fragile than the single-crystal layer 13a, insulating layer 14a, second substrate 20, single-crystal Si substrate, and the interfaces between the layers or substrates.

More specifically, the separation start portion 40 preferably has a structure in which the porous layer 12 is exposed to the side surface of the bonded substrate stack. More preferably, the outer peripheral edge of the porous layer 12 is located inside that of the transfer layer, as shown in FIG. 1D.

When the bonded substrate stack 30 having a projecting portion is formed, the transfer layer and underlying porous layer at that portion can be easily removed. This is because the transfer layer at the projecting portion is exposed to a larger degree than the transfer layer at the remaining portions. Hence, when a bonded substrate stack having a projecting portion is formed, the separation start portion can be easily formed.

When the separation start portion 40 is formed, the porous layer 12 can be selectively broken to separate the bonded substrate stack in the subsequent separating step. This effectively prevents defects in the separation step.

Figure 1E:
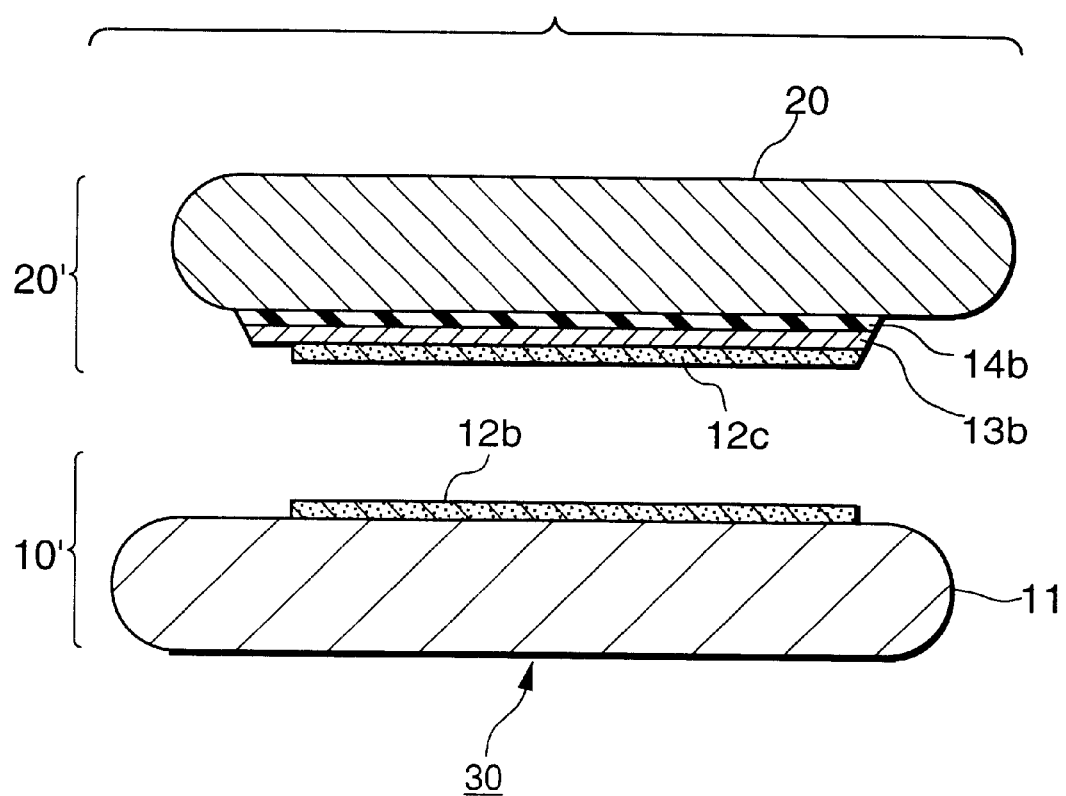
FIG. 1E is a schematic view for explaining the separation step (main separation step) in the method of manufacturing the SOI substrate according to the preferred embodiment of the present invention.

In the step shown in FIG. 1E, for the bonded substrate stack having the separation start portion 40, separation at the porous layer 12 of the separation start portion 40 is started. Finally, the bonded substrate stack is completely separated into two substrates at the porous layer 12. To separate the bonded substrate stack, for example, the following methods are preferably used.

(1) Separation Using Fluid

A stream of fluid (e.g., a liquid such as water or a gas such as air or nitrogen) is ejected to the gap at the outer peripheral portion of a bonded substrate stack. The bonded substrate stack is separated into two substrates at the porous layer 12 by the fluid.

(2) Separation Using Wedge

When a thin wedge of, e.g., a resin is gradually inserted into the gap at the outer peripheral portion of a bonded substrate stack, the bonded substrate stack is separated into two substrates at the porous layer 12.

(3) Separation by Peeling

One surface of a bonded substrate stack is fixed, and the other surface is pulled in the axial direction of the bonded substrate stack using a flexible tape or the like, thereby separating the bonded substrate stack at the porous layer.

(4) Separation Using Shearing Stress

One surface of a bonded substrate stack is fixed, and a force is applied to the other surface so as to move the other surface in the planar direction of the bonded substrate stack, thereby separating the bonded substrate stack at the porous layer by shearing stress.

The separation start portion formation step (pre-separation step) shown in FIG. 1D and the separation step (main separation step) shown in FIG. 1E may be continuously executed by one processing apparatus. For example, preferably, a water jet apparatus (separating apparatus using a fluid) is used, and the separation start portion formation step (pre-separation step) and the separation step (main separation step) are continuously executed using a fluid such as water. In this case, separation processing is started at the projecting portion and continued until the bonded substrate stack is completely separated.

As described above, when the separation start portion is formed, and then, separation processing is started from the separation start portion, the bonded substrate stack can substantially be separated only at the porous layer. Hence, break (generation of defects) of the single-crystal layer 13a, insulating layer 14a, second substrate 20, and single-crystal Si substrate 11, and the interfaces between the layers or substrates can be prevented.

In use of a bonded substrate stack having a projecting portion, when a separation start portion is formed at the projecting portion first, and overall separation is started from the separation start portion, the bonded substrate stack can substantially be separated only at the porous layer. Hence, the single-crystal layer 13, insulating layer 14, second substrate 20, and single-crystal Si substrate 11, and the interfaces between the layers or substrates can be prevented from breaking.

When a bonded substrate stack (normal bonded substrate stack) formed by bringing the first substrate 10 and second substrate 20 which have the same size into tight contact with each other while making their notches or orientation flats match is to be directly separated, the single-crystal Si layer 13, insulating layer 14, second substrate 20, and single-crystal Si substrate 11, and the interfaces between the layers or substrates may break to generate defects. This probably occurs due to the following mechanism.

In a bonded substrate stack, it is ideal that the porous layer 12 is most fragile. In fact, due to, e.g., stress acting between the porous layer 12, single-crystal Si layer 13, insulating layer 14, and second substrate 20 or bonding failure, a local portion as fragile as the porous layer 12 or a portion more fragile than the porous layer 12 (these portions will be referred to as defect inducing portions hereinafter) may be generated.

Such a defect inducing portion is preferentially broken in separation processing to result in defects. Defects are readily generated at a portion where separation processing starts, i.e., a portion to which the force for separation (separation force) is applied first. At the portion where separation processing starts, i.e., the outer peripheral portion of the bonded substrate stack, the same force acts on the porous layer 12, single-crystal Si layer 13, insulating layer 14, and second substrate 20. For this reason, if a defect inducing portion is present, it may be broken prior to the porous layer 12 at a high probability. As separation processing progresses, the force for separation (separation force) concentrically acts on the porous layer 12 as a layer whose average strength is most fragile, and the separation force hardly acts on the remaining portions. Hence, the porous layer 12 is selectively separated independently of the presence/absence of the defect inducing portion.

As in this embodiment, it is preferable to form the bonded substrate stack 30 having a projecting portion, form the separation start portion at the projecting portion, and start the subsequent separation processing from the separation start portion 40.

With the separation step shown in FIG. 1E, a first substrate 10' after separation has a structure wherein a porous Si layer 12b is formed on the single-crystal Si substrate 11. On the other hand, a second substrate 20' after separation has a multilayered structure of a porous layer 12c/single-crystal Si layer 13b/insulating layer 14b/single-crystal Si substrate 20.

That is, with the above process, the single-crystal Si layer 13 and insulating layer 14 on the porous layer 12 of the first substrate can be transferred to the second substrate. The porous layer 12 is an example of the separation layer, and the single-crystal Si layer 13 and insulating layer 14 are examples of the transfer layer to be transferred from the first substrate to the second substrate.

Figure 1F:
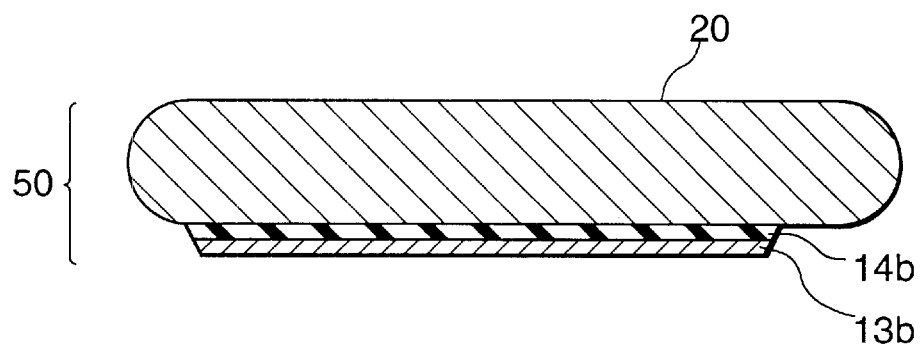
FIG. 1F is a schematic view for explaining the step of removing the porous layer on the second substrate side and the SOI substrate in the method of manufacturing the SOI substrate according to the preferred embodiment of the present invention.

In the step shown in FIG. 1F, the porous layer 12c on the surface of the second substrate 20' after separation is selectively removed. With this process, an SOI substrate 50 having a multilayered structure of a single-crystal Si layer 13b/insulating layer 14b/single-crystal Si substrate 20, i.e., an SOI structure can be obtained.

Figure 1G:
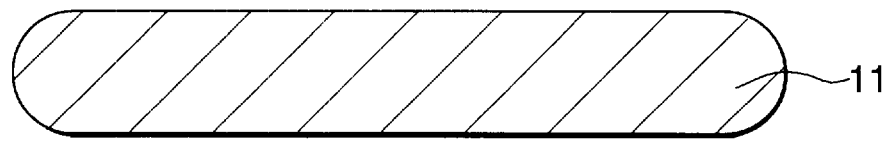
FIG. 1G is a schematic view for explaining the step of removing the porous layer on the first substrate side in the method of manufacturing the SOI substrate according to the preferred embodiment of the present invention.

In the step shown in FIG. 1G, the porous layer 12b on the single-crystal Si substrate 11 of the first substrate 10' after separation is selectively removed by, e.g., etching. A single-crystal Si substrate 11 obtained by this way can be reused as a substrate used to form a first substrate 10, or a second substrate 20 again.

As described above, according to this embodiment, a bonded substrate stack having a projecting portion is formed, and a separation start portion is formed at the projecting portion at the start of separation processing. In the subsequent separation processing, since the separation start portion is preferentially broken, defects can be prevented.

A processing apparatus suitable for execution of the separation start portion formation step (pre-separation step) and separation step (main separation step) shown in FIGS. 1D and 1E will be described next.

[First Processing Apparatus]

Figure 3:
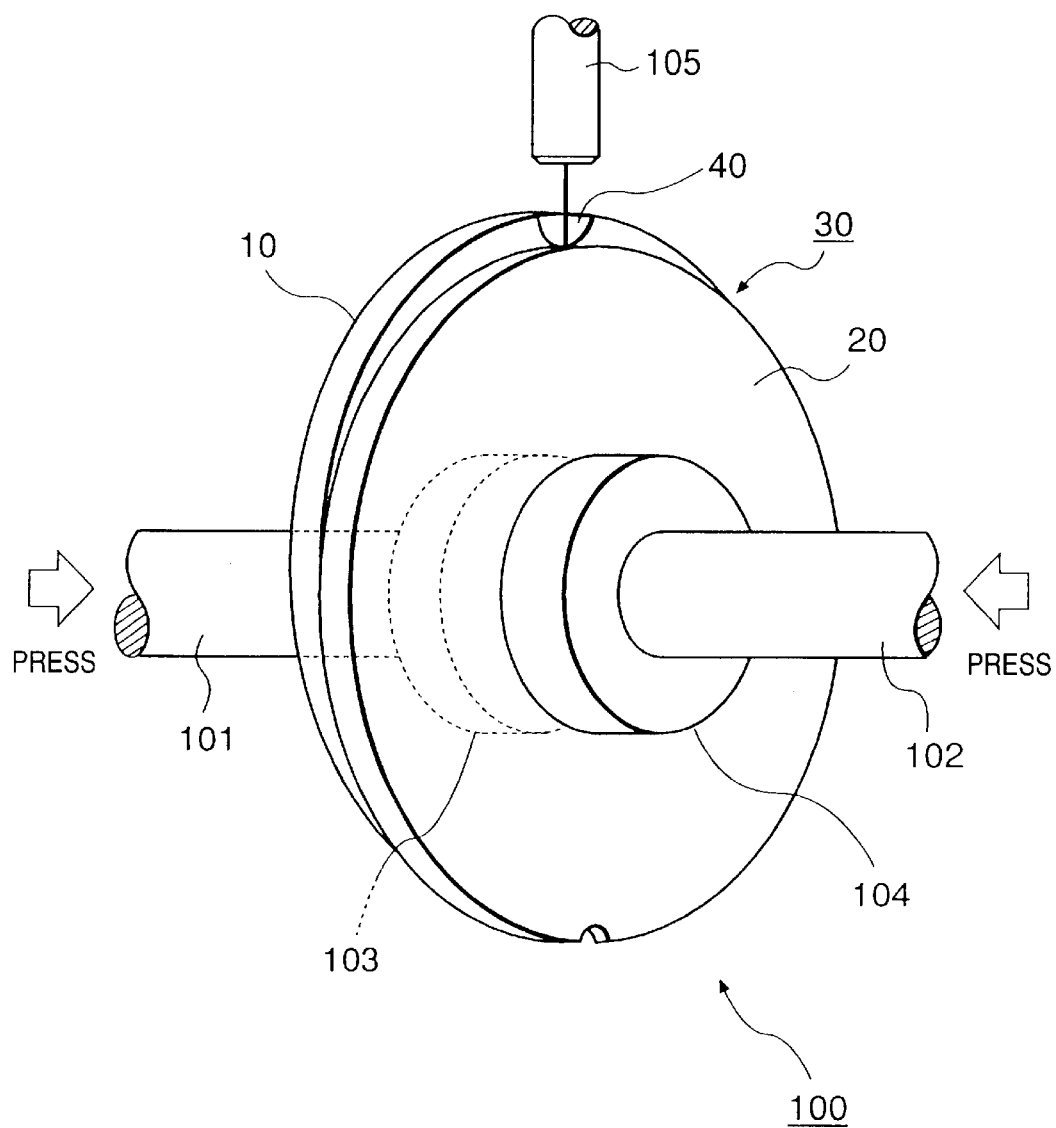
FIG. 3 is a view schematically showing formation of a separation start portion on the bonded substrate stack shown in FIG. 2.
Figure 4:
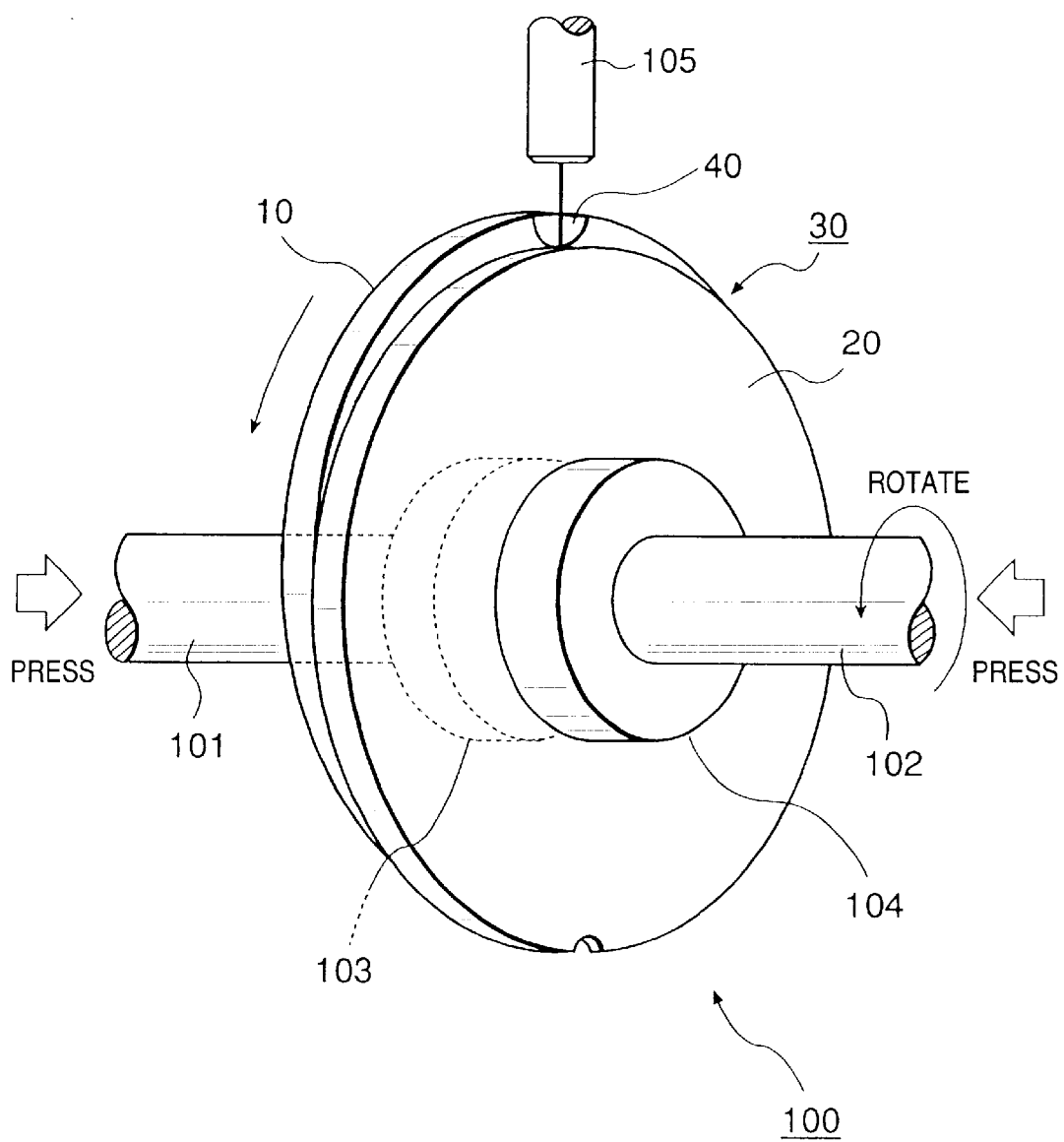
FIG. 4 is a view schematically showing separation of the bonded substrate stack shown in FIG. 3.
Figure 6:
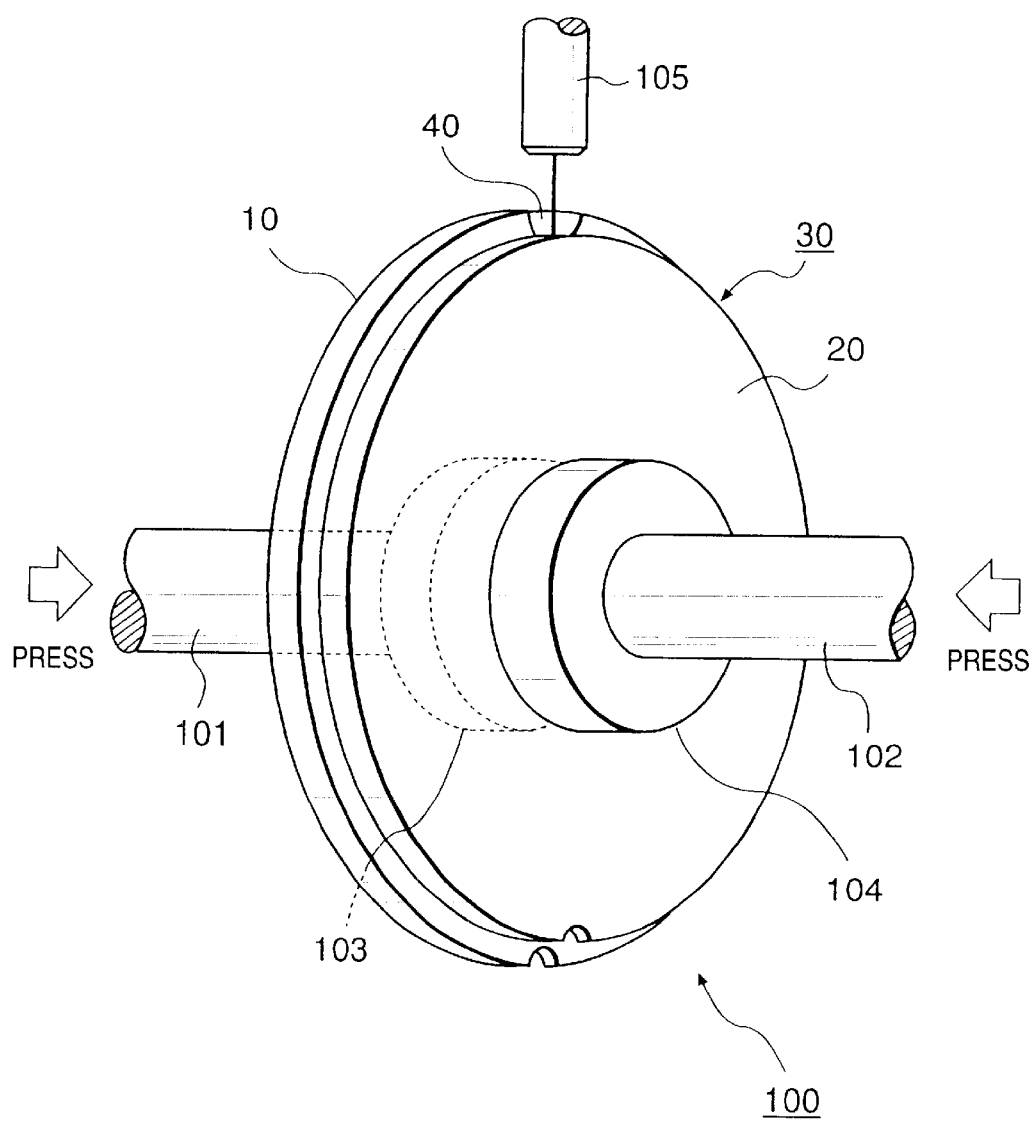
FIG. 6 is a view schematically showing formation of a separation start portion on the bonded substrate stack shown in FIG. 5.
Figure 7:
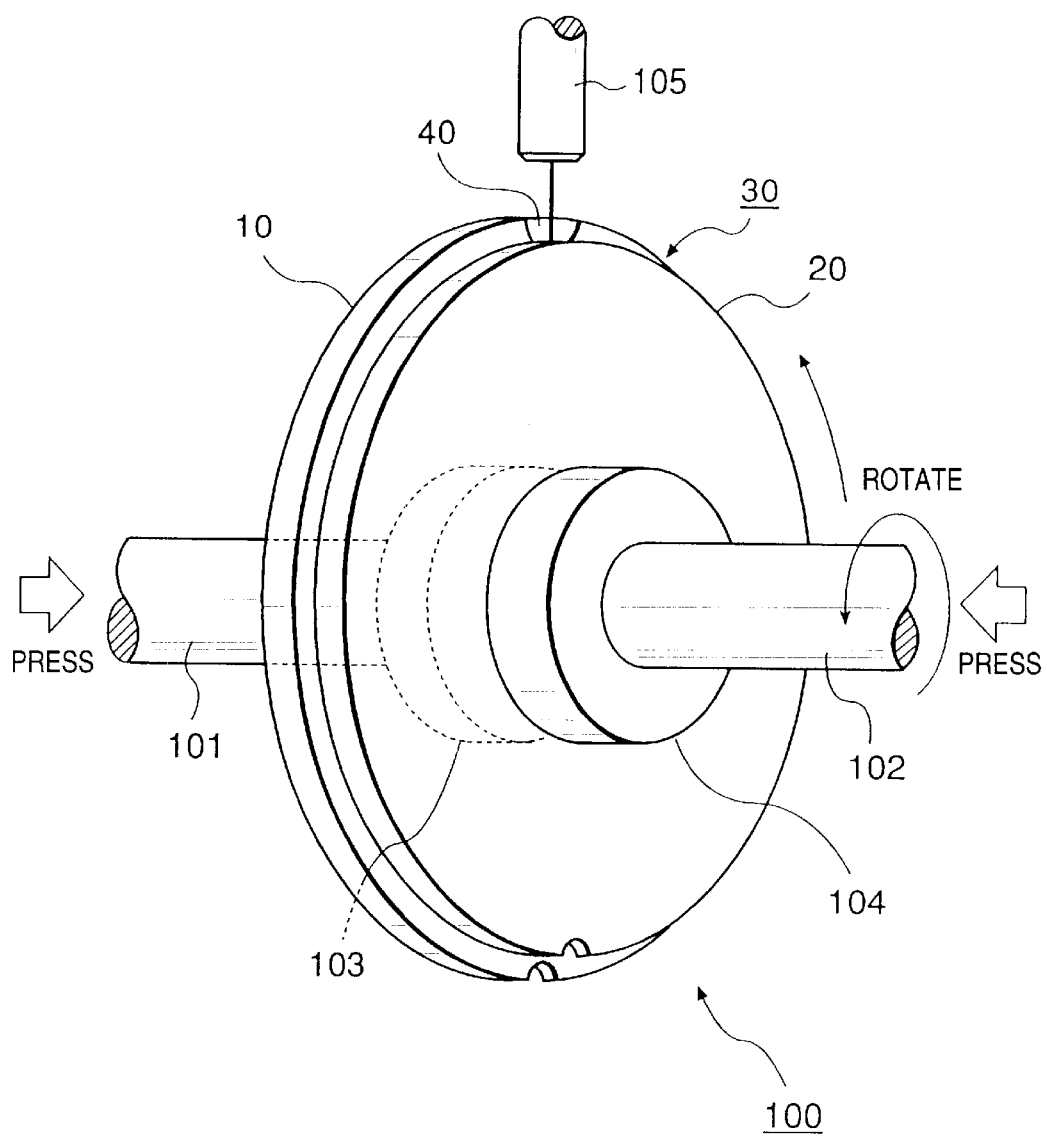
FIG. 7 is a view schematically showing separation of the bonded substrate stack shown in FIG. 6.

FIGS. 3, 4, 6, and 7 are views schematically showing the arrangement of a bonded substrate stack processing apparatus according to a preferred embodiment of the present invention. FIGS. 3 and 4 show an example of processing of a bonded substrate stack 30 shown in FIG. 2. FIGS. 6 and 7 show an example of processing of a bonded substrate stack 30 shown in FIG. 5.

A processing apparatus 100 shown in FIGS. 3, 4, 6, and 7 has a pair of substrate holding portions 103 and 104. The bonded substrate stack 30 is pressed and held from both sides by the substrate holding portions 103 and 104. The substrate holding portions 103 and 104 are coupled to rotating shafts 101 and 102 rotatably axially supported, respectively.

At least one of the rotating shafts 101 and 102 is coupled to an actuator (e.g., an air cylinder) for applying a press force to the bonded substrate stack 30 and increasing/decreasing the interval between the substrate holding portion 103 and the substrate holding portion 104. At least one of the rotating shafts 101 and 102 is coupled to the rotating shaft of a rotation source (e.g., a motor). The bonded substrate stack 30 can be rotated by a driving force generated by the rotation source.

This processing apparatus 100 has an ejection nozzle 105 for ejecting a liquid such as water or a gas such as air or nitrogen, i.e., a fluid. The ejection nozzle 105 preferably has a diameter of, e.g., about 0.1 mm. An apparatus using water as the fluid is especially called a water jet apparatus.

When this processing apparatus 100 is to be used in the separation start portion formation step (pre-separation step) shown in FIG. 1D, the bonded substrate stack 30 is fixed while keeping the projecting portion of the bonded substrate stack 30 opposing the ejection nozzle 105, as shown in FIG. 3 or 6. In this state, a fluid is ejected from the ejection nozzle 105 to the projecting portion of the bonded substrate stack 30.

When this processing apparatus 100 is to be used in the separation step (main separation step) shown in FIG. 1E, the bonded substrate stack 30 having the separation start portion 40 is set such that the separation start portion 40 opposes the ejection nozzle 105, as shown in FIG. 4 or 7. In this state, a fluid is ejected from the ejection nozzle 105 to the separation start portion 40. After that, separation is continued while rotating the bonded substrate stack 30.

When the processing apparatus 100 is to be continuously used in the separation start portion formation step (pre-separation step) and the separation step (main separation step), first, the bonded substrate stack is fixed, and in this state, a fluid is ejected from the ejection nozzle 105 to the projecting portion of the bonded substrate stack 30, as shown in FIG. 3 or 6. When the separation start portion 40 is formed, the bonded substrate stack 30 is rotated as shown in FIG. 4 or 7 to shift the process to the separation step (main separation step). After that, the bonded substrate stack 30 is completely separated at the porous layer while rotating the bonded substrate stack 30.

[Second Processing Apparatus]

Figure 8:
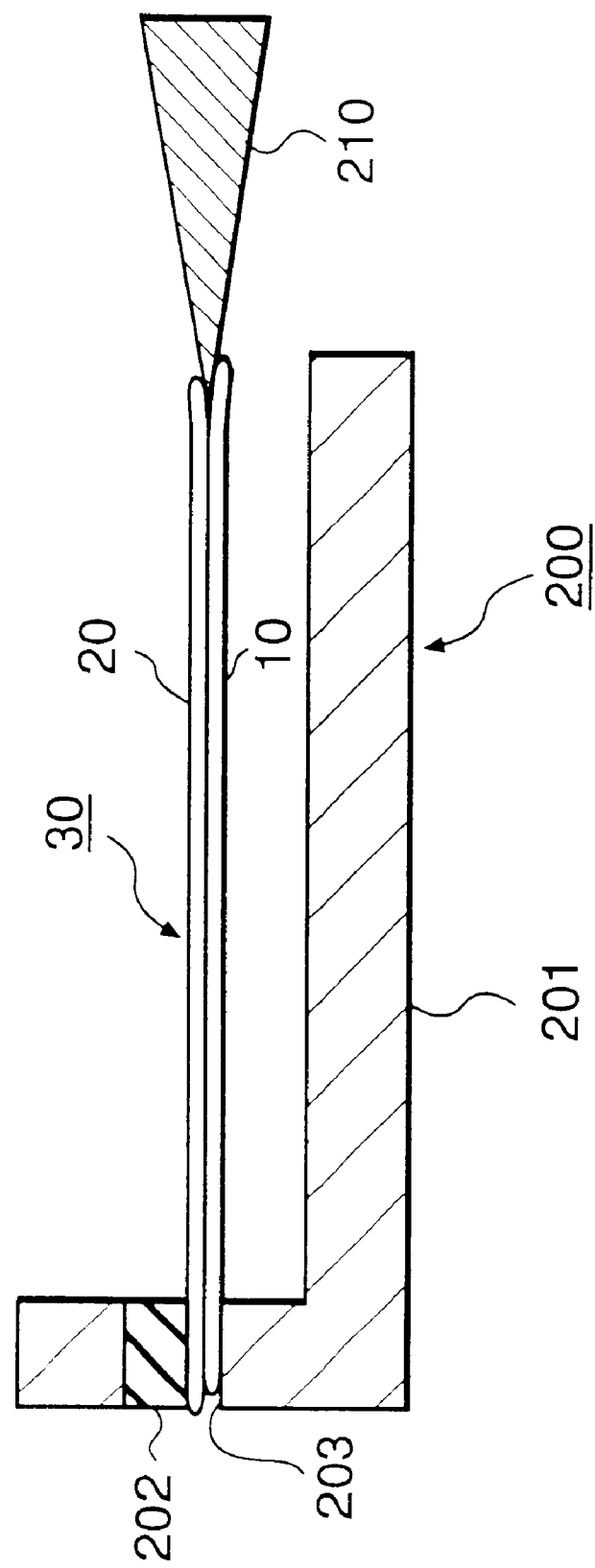
FIG. 8 is a view showing the schematic arrangement of a processing apparatus according to another preferred embodiment of the present invention.

FIG. 8 is a view schematically showing the arrangement of a bonded substrate stack processing apparatus according to another preferred embodiment of the present invention. A processing apparatus 200 shown in FIG. 8 has a support table 201 having a support portion 203 for supporting a bonded substrate stack 30, an elastic body 202 for pressing the bonded substrate stack 30 against the support portion 203, and a wedge 210.

When the processing apparatus 200 is to be used in the separation start portion formation step (pre-separation step) shown in FIG. 1D, the opposite side of the projecting portion of the bonded substrate stack 30 is supported by the support portion 203. In this state, the wedge 210 is moderately inserted in a predetermined amount near the bonding interface of the bonded substrate stack at the projecting portion. The porous layer and transfer layer on the porous layer at the projecting portion are broken, and the separation start portion is formed on the bonded substrate stack 30.

When the processing apparatus 200 is to be used in the separation step (main separation step) shown in FIG. 1E, the bonded substrate stack 30 having the separation start portion is supported by the support portion 203 at a portion on the opposite side of the separation start portion. In this state, the wedge 210 is moderately inserted into the separation start portion. After that, the wedge 210 is pushed into to continue separation.

FIG. 8 shows formation of the separation start portion on the bonded substrate stack 30 shown in FIG. 2. However, for the bonded substrate stack 30 shown in FIG. 5 or another bonded substrate stack having a projecting portion as well, a separation start portion can be formed by this processing apparatus 200.

When this processing apparatus 200 is to be continuously used in the separation start portion formation step (pre-separation step) and the separation step (main separation step), after formation of the separation start portion, the wedge 210 is further pressed into the bonded substrate stack 30.

[Third Processing Apparatus]

FIG. 9 is a view schematically showing the arrangement of a processing apparatus according to still another preferred embodiment of the present invention. A processing apparatus 300 shown in FIG. 9 has a process tank 301, and a vibration source 302 for supplying a vibration energy such as an ultrasonic wave to the process tank 301.

In this processing apparatus 300, the process tank 301 is filled with a vibration energy transmission medium (e.g., water or an etchant) 303. One or a plurality of bonded substrate stacks 30 stored in a carrier 310 are placed in the process tank 301, and in this state, the bonded substrate stacks 30 are processed.

When this processing apparatus 300 is to be used in the separation start portion formation step (pre-separation step) shown in FIG. 1D, one or a plurality of bonded substrate stacks are stored in the carrier 310 with their projecting portions facing down, as shown in FIG. 9. After that, the carrier 310 is placed in the process tank 301. The process tank 301 is filled with a vibration transmission medium (e.g., water or an etchant) such that the projecting portion of each bonded substrate stack 30 is dipped in the transmission medium, and the vibration source 302 is actuated. The vibration energy effectively acts on the porous layer under the transfer layer at the projecting portion to break the porous layer. Accordingly, the transfer layer on the porous layer is peeled, and a separation start portion is formed on each bonded substrate stack.

An SOI substrate manufacturing method has been described above. As the semiconductor layer 13 to be transferred from the first substrate to the second substrate, not the single-crystal Si layer but another Si layer such as a polysilicon layer or an amorphous Si layer may be formed. Alternatively, a Ge layer, SiGe layer, SiC layer, C layer, or a compound semiconductor (e.g., GaAs, InP, or GaN) layer may be formed. That is, the above SOI substrate manufacturing method and first substrate recycling method can also be applied to a method of manufacturing a semiconductor substrate other than an SOI substrate and the first substrate recycling method.

As the second substrate, in addition to the single-crystal Si substrate, an Si substrate having an oxide film formed on the surface, an insulating substrate (e.g., a quartz substrate), or a transparent substrate (e.g., a quartz substrate) is preferably used.

The first substrate 10 and second substrate 20 may be bonded by an adhesive.

The above method can be applied to the manufacture of a composite member formed by bringing a first member having a separation layer inside into tight contact with a second member or to separation of the composite member. In this case, the first member corresponds to the first substrate 10, the second member corresponds to the second substrate 20, the separation layer corresponds to the porous layer, and the composite member corresponds to the bonded substrate stack 30.

EXAMPLES

Specific examples of the above embodiments will be described below.

Example 1

First, to form a first substrate 10, a p- or n-type single-crystal Si substrate 11 having a resistivity of, e.g., 0.01 Ω·cm was prepared. The single-crystal Si substrate 11 was anodized in an HF solution in two steps to form a porous Si layer 12 having two porous layers with different porosities on the surface of the single-crystal Si substrate (FIG. 1A). The anodizing conditions were as follows.

<First Anodizing Conditions>

Current density: 7 ($mA/cm^2$)

Anodizing solution: $HF:H_2O:C_2H_5OH=1:1:1$

Process time: 5 (min)

Porous Si thickness: 4.5 ($\mu$m)

<Second Anodizing Conditions>

Current density: 30 ($mA/cm^2$)

Anodizing solution: $HF:H_2O:C_2H_5OH=1:1:1$

Process time: 10 (min)

Porous Si thickness: 0.2 ($\mu$m)

In Example 1, the porous layer 12 had a two-layered structure. The surface-side porous layer formed in the first step using a low current was used to form a high-quality epitaxial Si layer 13. The lower porous layer formed in the second step using a high current was used as a separation layer. The thickness of the porous layer formed in the first anodizing step is not limited to the above example and preferably, e.g., several hundred to 0.1 $\mu$m. The thickness of the porous layer formed in the second anodizing step is not limited to the above example, either, and can be appropriately changed in accordance with conditions of the subsequent separation processing.

The porous layer 12 may have one layer or three or more layers.

Next, this substrate was oxidized in an oxygen atmosphere at 400° C. for 1 hr. With this oxidation, the inner walls of pores in the porous layer 12 were covered with thermal oxide films.

A 0.3-$\mu$m thick single-crystal Si layer 13 was epitaxially grown on the porous Si layer 12 by CVD (Chemical Vapor Deposition) (FIG. 1B). The growth conditions were as follows. At the early stage of epitaxial growth, the surface of the porous Si layer 12 was exposed to $H_2$. Hence, holes on the surface were filled to form a flat surface.

<Epitaxial Growth Conditions>

Source gas: $SiH_2Cl_2/H_2$

Gas flow rate: 0.5/180 (1/min)

Gas pressure: 80 (Torr)

Temperature: 950 (°C.)

Growth rate: 0.30 ($\mu$m/min)

A 200-nm thick $SiO_2$ layer 14 was formed on the surface of the epitaxially grown single-crystal Si layer 13 by thermal oxidation (FIG. 1B). With this process, the first substrate 10 was obtained.

An Si substrate (second substrate) 20 having the same size as that of the first substrate 10 was prepared. The surface of the $SiO_2$ layer 14 of the first substrate 10 was brought into tight contact with the second substrate 20 while shifting their central positions. The resultant structure was annealed at 1,180° C. for 5 min to form a bonded substrate stack 30 as shown in FIG. 2, which had a projecting portion (FIG. 1C). In Example 1, the two substrates were bonded while shifting the center of the first substrate 10 from that of the second substrate 20 by 0.1 mm.

As shown in FIG. 3, the bonded substrate stack 30 was set in a processing apparatus 100 while making the projecting portion of the bonded substrate stack 30 oppose an ejection nozzle 105. A fluid (in this case, water) at a pressure of 500 $kgf/cm^2$ was ejected from the ejection nozzle 105 having a diameter of 0.1 mm to the projecting portion for several sec to form a separation start portion 40 on the bonded substrate stack 30 (FIG. 1D).

As shown in FIG. 4, while the fluid was being injected into the separation start portion 40, the pressure of the fluid ejected from the ejection nozzle 105 was reduced to 400 $kgf/cm^2$. As shown in FIG. 4, while rotating the bonded substrate stack 30, the bonded substrate stack 30 was completely separated at the porous layer 12 (FIG. 1E).

A porous layer 12b remaining on the surface of a second substrate 20' after separation was selectively etched using, as an etchant, a solution mixture of 49% hydrofluoric acid, 30% hydrogen peroxide, and water. (FIG. 1F). With this process, an SOI substrate as shown in FIG. 1F was obtained.

The porous layer 12b remaining on the surface of the single-crystal Si substrate 11 was selectively etched using, as an etchant, a solution mixture of 49% hydrofluoric acid, 30% hydrogen peroxide, and water (FIG. 1G).

Instead of the single-crystal Si layer 13, for example, another Si layer such as a polysilicon layer or an amorphous Si layer may be formed, or a Ge layer, SiGe layer, SiC layer, C layer, or a compound semiconductor (e.g., GaAs, InP, or GaN) layer may be formed.

As the second substrate 20, instead of the single-crystal Si substrate, an Si substrate having an oxide film formed on the surface, an insulating substrate (e.g., a quartz substrate), or a transparent substrate (e.g., a quartz substrate) may be used.

Example 2

First, to form a first substrate 10, a p- or n-type single-crystal Si substrate 11 having a resistivity of, e.g., 0.01 Ω·cm was prepared. The single-crystal Si substrate 11 was anodized in an HF solution in two steps to form a porous Si layer 12 having two porous layers with different porosities on the surface of the single-crystal Si substrate (FIG. 1A). The anodizing conditions were as follows.
<First Anodizing Conditions>
  Current density: 7 ($mA/cm^2$),
  Anodizing solution: $HF:H_2O:C_2H_5OH=1:1:1$
  Process time: 5 (min)
  Porous Si thickness: 4.5 ($\mu$m)
<Second Anodizing Conditions>
  Current density: 30 ($MA/cm^2$)
  Anodizing solution: $HF:H_2O:C_2H_5OH=1:1:1$
  Process time: 10 (min)
  Porous Si thickness: 0.2 ($\mu$m)

In Example 2, the porous layer 12 had a two-layered structure. The surface-side porous layer formed in the first step using a low current was used to form a high-quality epitaxial Si layer 13. The lower porous layer formed in the second step using a high current was used as a separation layer. The thickness of the porous layer formed in the first anodizing step is not limited to the above example and preferably, e.g., several hundred to 0.1 $\mu$m. The thickness of the porous layer formed in the second anodizing step is not limited to the above example, either, and can be appropriately changed in accordance with conditions of the subsequent separation processing.

The porous layer 12 may have one layer or three or more layers.

Next, this substrate was oxidized in an oxygen atmosphere at 400° C. for 1 hr. With this oxidation, the inner walls of pores in the porous layer 12 were covered with thermal oxide films.

A 0.3-$\mu$m thick single-crystal Si layer 13 was epitaxially grown on the porous Si layer 12 by CVD (Chemical Vapor Deposition) (FIG. 1B). The growth conditions were as follows. At the early stage of epitaxial growth, the surface of the porous Si layer 12 was exposed to $H_2$. Hence, holes on the surface were filled to form a flat surface.
<Epitaxial Growth Conditions>
  Source gas: $SiH_2Cl_2/H_2$
  Gas flow rate: 0.5/180 (1/min)
  Gas pressure: 80 (Torr)
  Temperature: 950 (°C.)
  Growth rate: 0.30 ($\mu$m/min)

A 200-nm thick $SiO_2$ layer 14 was formed on the surface of the epitaxially grown single-crystal Si layer 13 by thermal oxidation (FIG. 1B). With this process, the first substrate 10 was obtained.

An Si substrate (second substrate) 20 having the same size as that of the first substrate 10 was prepared. The surface of the $SiO_2$ layer 14 of the first substrate 10 was brought into tight contact with the second substrate 20 while shifting their central positions. The resultant structure was annealed at 1,180° C. for 5 min to form a bonded substrate stack 30 as shown in FIG. 2, which had a projecting portion (FIG. 1C). In Example 2, the two substrates were bonded while shifting the center of the first substrate 10 from that of the second substrate 20 by 0.1 mm.

As shown in FIG. 8, a portion on the opposite side of the projecting portion of the bonded substrate stack 30 was supported by a support portion 203 of a processing apparatus 200. In this state, a wedge 210 was inserted by 1.5 mm into the gap at the projecting portion of the bonded substrate stack 30 in parallel to the bonding interface of the bonded substrate stack 30 (FIG. 1D). As the wedge 210, a PTFE wedge having a tip angle of 20° was used. With this process, the bonded substrate stack 30 having a separation start portion was obtained.

As shown in FIG. 4, the bonded substrate stack 30 was set in a processing apparatus 100 while making a separation start portion 40 of the bonded substrate stack 30 oppose an ejection nozzle 105. A fluid at a pressure of 400 $kgf/cm^2$ was ejected from the ejection nozzle 105 having a diameter of 0.1 mm to the separation start portion 40 to start separation. After that, separation was continued while rotating the bonded substrate stack 30, and the bonded substrate stack 30 was separated into two substrates at a porous layer 12a (FIG. 1E).

A porous layer 12b remaining on the surface of a second substrate 20' after separation was selectively etched using, as an etchant, a solution mixture of 49% hydrofluoric acid, 30% hydrogen peroxide, and water (FIG. 1F). With this process, an SOI substrate as shown, in FIG. 1F was obtained.

The porous layer 12b remaining on the surface of the single-crystal Si substrate 11 was selectively etched using, as an etchant, a solution mixture of 49% hydrofluoric acid, 30% hydrogen peroxide, and water (FIG. 1G).

Instead of the single-crystal Si layer 13, for example, another Si layer such as a polysilicon layer or an amorphous Si layer may be formed, or a Ge layer, SiGe layer, SiC layer, C layer, or a compound semiconductor (e.g., GaAs, InP, or GaN) layer may be formed.

As the second substrate 20, instead of the single-crystal Si substrate, an Si substrate having an oxide film formed on the surface, an insulating substrate (e.g., a quartz substrate), or a transparent substrate (e.g., a quartz substrate) may be used.

Example 3

First, to form a first substrate 10, a p- or n-type single-crystal Si substrate 11 having a resistivity of, e.g., 0.01 Ω·cm was prepared. The single-crystal Si substrate 11 was anodized in an HF solution in two steps to form a porous Si layer 12 having two porous layers with different porosities on the surface of the single-crystal Si substrate (FIG. 1A). The anodizing conditions were as follows.

<First Anodizing Conditions>

Current density: 7 (mA/cm$^2$)

Anodizing solution: HF:H$_2$O:C$_2$H$_5$OH=1:1:1

Process time: 5 (min)

Porous Si thickness: 4.5 ($\mu$m)

<Second Anodizing Conditions>

Current density: 30 (mA/cm$^2$)

Anodizing solution: HF:H$_2$O:C$_2$H$_5$OH=1:1:1

Process time: 10 (min)

Porous Si thickness: 0.2 ($\mu$m)

In Example 3, the porous layer 12 had a two-layered structure. The surface-side porous layer formed in the first step using a low current was used to form a high-quality epitaxial Si layer 13. The lower porous layer formed in the second step using a high current was used as a separation layer. The thickness of the porous layer formed in the first anodizing step is not limited to the above example and preferably, e.g., several hundred to 0.1 $\mu$m. The thickness of the porous layer formed in the second anodizing step is not limited to the above example, either, and can be appropriately changed in accordance with conditions of the subsequent separation processing.

The porous layer 12 may have one layer or three or more layers.

Next, this substrate was oxidized in an oxygen atmosphere at 400° C. for 1 hr. With this oxidation, the inner walls of pores in the porous layer 12 were covered with thermal oxide films.

A 0.3-$\mu$m thick single-crystal Si layer 13 was epitaxially grown on the porous Si layer 12 by CVD (Chemical Vapor Deposition) (FIG. 1B). The growth conditions were as follows. At the early stage of epitaxial growth, the surface of the porous Si layer 12 was exposed to H$_2$. Hence, holes on the surface were filled to form a flat surface.

<Epitaxial Growth Conditions>

Source gas: SiH$_2$Cl$_2$/H$_2$

Gas flow rate: 0.5/180 (1/min)

Gas pressure: 80 (Torr)

Temperature: 950 (°C.)

Growth rate: 0.30 ($\mu$m/min)

A 200-nm thick SiO$_2$ layer 14 was formed on the surface of the epitaxially grown single-crystal Si layer 13 by thermal oxidation (FIG. 1B). With this process, the first substrate 10 was obtained.

An Si substrate (second substrate) 20 having the same size as that of the first substrate 10 was prepared. The surface of the SiO$_2$ layer 14 of the first substrate 10 was brought into tight contact with the second substrate 20 while shifting their central positions. The resultant structure was annealed at 1,180° C. for 5 min to form a bonded substrate stack 30 as shown in FIG. 2, which had a projecting portion (FIG. 1C). In Example 3, the two substrates were bonded while shifting the center of the first substrate 10 from that of the second substrate 20 by 0.1 mm.

As shown in FIG. 9, a plurality of bonded substrate stacks 30 were stored in a carrier 310 while making their projecting portions face down. After that, the carrier 310 was placed in a process tank 301. The carrier 310 was filled with pure water (vibration transmission medium) such that the projecting portions of the bonded substrate stacks 30 were dipped. A vibration source 302 was operated for about 1 hr to form a separation start portion on each bonded substrate stack 30 (FIG. 1E).

Instead of pure water, an etchant can also be preferably used. In this case, the vibration source 302 is still preferably actuated to supply the vibration energy to the projecting portions. Even when no vibration energy is supplied to the projecting portions, separation start portions can be formed by the etching function of the etchant. An example of use of an etchant will be described. Preferably, the projecting portion of a bonded substrate stack is dipped in hydrofluoric acid to remove the insulating layer (SiO$_2$ layer) 14 at the projecting portion, then, the projecting portion is dipped in fluoronitric acid to remove the single-crystal Si layer 13 at the projecting portion, and finally, the porous layer 12 at the projecting portion is removed.

As shown in FIG. 4, the bonded substrate stack 30 was set in a processing apparatus 100 while making a separation start portion 40 of the bonded substrate stack 30 oppose an ejection nozzle 105. A fluid at a pressure of 400 kgf/cm$^2$ was ejected from the ejection nozzle 105 having a diameter of 0.1 mm to the separation start portion 40 to start separation. After that, separation was continued while rotating the bonded substrate stack 30, and the bonded substrate stack 30 was separated into two substrates at a porous layer 12a (FIG. 1E).

A porous layer 12b remaining on the surface of a second substrate 20' after separation was selectively etched using, as an etchant, a solution mixture of 49% hydrofluoric acid, 30% hydrogen peroxide, and water (FIG. 1F). With this process, an SOI substrate as shown in FIG. 1F was obtained.

The porous layer 12b remaining on the surface of the single-crystal Si substrate 11 was selectively etched using, as an etchant, a solution mixture of 49% hydrofluoric acid, 30% hydrogen peroxide, and water (FIG. 1G).

Instead of the single-crystal Si layer 13, for example, another Si layer such as a polysilicon layer or an amorphous Si layer may be formed, or a Ge layer, SiGe layer, SiC layer, C layer, or a compound semiconductor (e.g., GaAs, InP, or GaN) layer may be formed.

As the second substrate 20, instead of the single-crystal Si substrate, an Si substrate having an oxide film formed on the surface, an insulating substrate (e.g., a quartz substrate), or a transparent substrate (e.g., a quartz substrate) may be used.

Example 4

First, to form a first substrate 10, a p- or n-type single-crystal Si substrate 11 having a resistivity of, e.g., 0.01 Ω·cm was prepared. The single-crystal Si substrate 11 was anodized in an HF solution in two steps to form a porous Si layer 12 having two porous layers with different porosities on the surface of the single-crystal Si substrate (FIG. 1A). The anodizing conditions were as follows.

<First Anodizing Conditions>

Current density: 7 (mA/cm$^2$)
Anodizing solution: $HF:H_2O:C_2H_5OH=1:1:1$
process time: 5 (min)
Porous Si thickness: 4.5 ($\mu$m)

<Second Anodizing Conditions>

Current density: 30 (mA/cm$^2$)
Anodizing solution: $HF:H_2O:C_2H_5OH=1:1:1$
Process time: 10 (min)
Porous Si thickness: 0.2 ($\mu$m)

In Example 4, the porous layer 12 had a two-layered structure. The surface-side porous layer formed in the first step using a low current was used to form a high-quality epitaxial Si layer 13. The lower porous layer formed in the second step using a high current was used as a separation layer. The thickness of the porous layer formed in the first anodizing step is not limited to the above example and preferably, e.g., several hundred to 0.1 $\mu$m. The thickness of the porous layer formed in the second anodizing step is not limited to the above example, either, and can be appropriately changed in accordance with conditions of the subsequent separation processing.

The porous layer 12 may have one layer or three or more layers.

Next, this substrate was oxidized in an oxygen atmosphere at 400° C. for 1 hr. With this oxidation, the inner walls of pores in the porous layer 12 were covered with thermal oxide films.

A 0.3-$\mu$m thick single-crystal Si layer 13 was epitaxially grown on the porous Si layer 12 by CVD (Chemical Vapor Deposition) (FIG. 1B). The growth conditions were as follows. At the early stage of epitaxial growth, the surface of the porous Si layer 12 was exposed to $H_2$. Hence, holes on the surface were filled to form a flat surface.

<Epitaxial Growth Conditions>

Source gas: $SiH_2Cl_2/H_2$
Gas flow rate: 0.5/180 (1/min)
Gas pressure: 80 (Torr)
Temperature: 950 (°C.)
Growth rate: 0.30 ($\mu$m/min)

A 200-nm thick $SiO_2$ layer 14 was formed on the surface of the epitaxially grown single-crystal Si layer 13 by thermal oxidation (FIG. 1B). With this process, the first substrate 10 was obtained.

An Si substrate (second substrate) 20 having a diameter smaller than that of the first substrate 10 by 0.5 mm was prepared. The surface of the $SiO_2$ layer 14 of the first substrate 10 was brought into tight contact with the second substrate 20 while making the center of the first substrate 10 match that of the second substrate. The resultant structure was annealed at 1,180° C. for 5 min to form a bonded substrate stack 30 as shown in FIG. 2, which had a projecting portion (FIG. 1C). The projecting portion may be formed by bringing the first substrate 10 and second substrate 20, which have the same size, into tight contact with each other, annealing them to form a bonded substrate stack, and then grinding the outer peripheral portion of the second substrate 20 of the bonded substrate stack using an edge grinder or the like.

As shown in FIG. 6, the bonded substrate stack 30 was set in a processing apparatus 100 while making the projecting portion of the bonded substrate stack 30 oppose an ejection nozzle 105. A fluid (in this case, water) at a pressure of 400 kgf/cm was ejected from the ejection nozzle 105 having a diameter of 0.1 mm to the projecting portion to form a separation start portion 40 on the bonded substrate stack 30 (FIG. 1D).

As shown in FIG. 7, while keeping the fluid ejected from the ejection nozzle 105, rotation of the bonded substrate stack 30 was started. Subsequently, while rotating the bonded substrate stack 30, it was completely separated at the porous layer 12 (FIG. 1E).

A porous layer 12b remaining on the surface of a second substrate 20' after separation was selectively etched using, as an etchant, a solution mixture of 49% hydrofluoric acid, 30% hydrogen peroxide, and water (FIG. 1F). With this process, an SOI substrate as shown in FIG. 1F was obtained.

The porous layer 12b remaining on the surface of the single-crystal Si substrate 11 was selectively etched using, as an etchant, a solution mixture of 49% hydrofluoric acid, 30% hydrogen peroxide, and water (FIG. 1G).

Instead of the single-crystal Si layer 13, for example, another Si layer such as a polysilicon layer or an amorphous Si layer may be formed, or a Ge layer, SiGe layer, SiC layer, C layer, or a compound semiconductor (e.g., GaAs, InP, or GaN) layer may be formed.

As the second substrate 20, instead of the single-crystal Si substrate, an Si substrate having an oxide film formed on the surface, an insulating substrate (e.g., a quartz substrate), or a transparent substrate (e.g., a quartz substrate) may be used.

Example 5

In Example 5, a porous layer (microcavity layer) was formed by ion implantation.

First, a 200-$\mu$m thick $SiO_2$ layer was formed on the surface of a single-crystal Si substrate by thermal oxidation. Ions were implanted through the $SiO_2$ layer in the single-crystal Si substrate such that the projection range corresponds to a predetermined depth in the single-crystal Si substrate. With this ion implantation, a substrate substantially same to a first substrate 10 shown in FIG. 1B, i.e., a substrate sequentially having, on a single-crystal Si substrate 11, a porous layer (ion implantation layer or microcavity layer) 12, single-crystal Si layer 13, and insulating layer was formed.

The surface of an $SiO_2$ layer of the first substrate 10 was brought into tight contact with the surface of an independently prepared 8-inch Si substrate (second substrate) 20. Annealing was performed at 600° C. for 10 hrs to increase the bonding strength. A bonded substrate stack as shown in FIG. 1C was obtained. In Example 5, the two substrates were bonded while shifting the center of the first substrate 10 from that of the second substrate 20 by 0.1 mm.

As shown in FIG. 3, the bonded substrate stack 30 was set in a processing apparatus 100 while making the projecting portion of the bonded substrate stack 30 oppose an ejection nozzle 105. A fluid (in this case, water) at a pressure of 500 kgf/cm$^2$ was ejected from the ejection nozzle 105 having a diameter of 0.1 mm to the projecting portion for several sec to form a separation start portion 40 on the bonded substrate stack 30 (FIG. 1D).

As shown in FIG. 4, while the fluid was being injected into the separation start portion 40, the pressure of the fluid ejected from the ejection nozzle 105 was reduced to 400 kgf/cm$^2$. As shown in FIG. 4, while rotating the bonded substrate stack 30, the bonded substrate stack 30 was completely separated at the porous layer 12 (FIG. 1E).

A porous layer 12b remaining on the surface of a second substrate 20' after separation was selectively etched using, as an etchant, a solution mixture of 49% hydrofluoric acid, 30% hydrogen peroxide, and water (FIG. 1F). With this process, an SOI substrate as shown in FIG. 1F was obtained.

The porous layer 12b remaining on the surface of the single-crystal Si substrate 11 was selectively etched using, as an etchant, a solution mixture of 49% hydrofluoric acid, 30% hydrogen peroxide, and water (FIG. 1G).

Instead of the single-crystal Si layer 13, for example, another Si layer such as a polysilicon layer or an amorphous Si layer may be formed, or a Ge layer, SiGe layer, SiC layer, C layer, or a compound semiconductor (e.g., GaAs, InP, or GaN) layer may be formed.

As the second substrate 20, instead of the single-crystal Si substrate, an Si substrate having an oxide film formed on the surface, an insulating substrate (e.g., a quartz substrate), or a transparent substrate (e.g., a quartz substrate) may be used.

According to the present invention, a composite member such as a bonded substrate stack can be appropriately separated at a separation layer such as a porous layer.

The present invention is not limited to the above embodiments and various changes and modifications can be made within the spirit and scope of the present invention. Therefore, to apprise the public of the scope of the present invention, the following claims are made.

What is claimed is:

1. A method of separating a composite member having a structure in which a first member having a separation layer inside is brought into tight contact with a second member, wherein said composite member has a projecting portion at which an outer peripheral edge of said first member projects outside that of said second member, and said method comprises the separation step of starting separating said composite member from said projecting portion and then separating said composite member into two members at said separation layer.

2. The method according to claim 1, wherein a major surface of said first member has the same shape as that of said second member, and said composite member has a structure in which the major surface of said first member is brought into tight contact with the major surface of said second member while shifting central positions from each other.

3. The method according to claim 1, wherein a major surface of said second member is smaller than that of said first member, and said composite member has a structure in which the major surface of said first member is brought into tight contact with the major surface of said second member.

4. The method according to claim 1, wherein the separation step comprises:

the pre-separation step of processing said projecting portion to form a separation start portion; and the main separation step of starting separating said composite member from said separation start portion and then breaking substantially only said separation layer to separate said composite member into two members at said separation layer.

5. A method of bringing a first member having a separation layer inside into tight contact with a second member to manufacture a composite member having a projecting portion at which an outer peripheral edge of said first member projects outside that of said second member, wherein said separation layer is adapted to separate by the method of claim 1.

6. A method of transferring a transfer layer on a surface of a first member to a second member, comprising:

a preparation step of bringing a first member having a separation layer inside and said transfer layer on said separation layer into tight contact with a second member to prepare a composite member in which an outer peripheral edge of said first member projects outside that of said second member; and a separation step for starting separating said composite member from said projecting portion and separating said composite member into two members at said separation layer, thereby transferring said transfer layer of said first member to said second member.

7. A separating method of separating into two substrates a bonded substrate stack having a structure formed by bringing a transfer layer of a first substrate having a separation layer inside and said transfer layer on said separation layer into tight contact with a second substrate, wherein said bonded substrate stack has a projecting portion at which an outer peripheral edge of said first substrate projects outside that of said second substrate, and said separation method comprises the separation step of starting separating said bonded substrate stack from said projecting portion and then separating said bonded substrate stack into two substrates at said separation layer.

8. The method according to claim 7, wherein said first substrate has the same size as that of said second substrate, and said bonded substrate stack has a structure in which said first substrate and said second substrate are brought into tight contact while shifting central positions from each other.

9. The method according to claim 7, wherein said bonded substrate stack has a structure in which said first substrate is brought into tight contact with said second substrate smaller than said first substrate.

10. The method according to claim 7, wherein said second substrate has one of an orientation flat and a notch, and said bonded substrate stack has, as said projecting portion, a portion where said first substrate is exposed in the presence of the orientation flat or notch of said second substrate.

11. The method according to claim 7, wherein each of said first substrate and said second substrate has one of an orientation flat and a notch, and said bonded substrate stack is formed by bringing said first substrate and said second substrate into tight contact with each other without matching the orientation flat or notch of said first substrate with the orientation flat or notch of said second substrate, and has, as said projecting portion, a portion where said first substrate is exposed in the presence of the orientation flat or notch of said second substrate.

12. A method of bonding a transfer layer of a first substrate having a separation layer inside and said transfer layer on said separation layer to a second substrate to manufacture a bonded substrate stack having a projecting portion at which an outer peripheral edge of said first substrate projects outside that of said second substrate, wherein said separation layer is adapted to separate by the method of claim 1.

13. A transfer method of transferring a transfer layer on a surface of a first substrate to a second substrate, comprising:

the preparation step of bonding said transfer layer of said first substrate having a separation layer inside and said transfer layer on said separation layer to said second substrate to prepare a bonded substrate stack having a projecting portion at which an outer peripheral edge of said first substrate projects outside that of said second substrate; and the separation step of starting separating said bonded substrate stack from said projecting portion and then separating said bonded substrate stack at said separation layer, thereby transferring said transfer layer of said first substrate to said second substrate.

14. The method according to claim 13, wherein the preparation step comprises bringing said first substrate and said second substrate, which have the same size, into tight contact with each other while shifting central positions to prepare said bonded substrate stack.

15. The method according to claim 13, wherein the preparation step comprises bringing said first substrate into tight contact with said second substrate smaller than said first substrate to prepare said bonded substrate stack.

16. The method according to claim 13, wherein the preparation step comprises bringing said first substrate into tight contact with said second substrate having one of an orientation flat and a notch to prepare said bonded substrate stack having, as said projecting portion, a portion where said first substrate is exposed in the presence of the orientation flat or notch of said second substrate.

17. The method according to claim 13, wherein the preparation step comprises preparing said first substrate and said second substrate each having one of an orientation flat and a notch, and bringing said first substrate and said second substrate into tight contact with each other without matching the orientation flat or notch of said first substrate with the orientation flat or notch of said second substrate to prepare said bonded substrate stack.

18. The method according to claim 13, wherein the separation step comprises:
the pre-separation step of processing said projecting portion to form a separation start portion; and
starting separating said bonded substrate stack from said separation start portion and then breaking substantially only said separation layer to separate said bonded substrate stack into two substrates at said separation layer.

19. The method according to claim 18, wherein the pre-separation step comprises ejecting a fluid to said projecting portion to form said separation start portion by the fluid.

20. The method according to claim 18, wherein the pre-separation step comprises inserting a wedge-shaped member into a gap between said first substrate and said second substrate at said projecting portion to form said separation start portion.

21. The method according to claim 18, wherein the pre-separation step comprises supplying a vibration energy to said projecting portion to form said separation start portion.

22. The method according to claim 18, wherein the pre-separation step comprises dipping said projecting portion in a liquid and supplying a vibration energy to said projecting portion through the liquid to form said separation start portion.

23. The method according to claim 22, wherein water is used as the liquid.

24. The method according to claim 22, wherein an etchant is used as the liquid.

25. The method according to claim 18, wherein the pre-separation step comprises etching said transfer layer and said separation layer at said projecting portion to form said separation start portion.

26. The method according to claim 13, wherein the separation step comprises ejecting a fluid to said projecting portion to form said separation start portion on said bonded substrate stack and continuing separating said bonded substrate stack while changing a position where the fluid is injected.

27. The method according to claim 13, wherein the separation step comprises inserting a wedge-shaped member into a gap between said first substrate and said second substrate at said projecting portion to separate said bonded substrate stack.

28. The method according to claim 18, wherein said separation start portion is a portion where said separation layer at said portion has the most fragile structure.

29. The method according to claim 18, wherein said separation start portion is a portion where said transfer layer at said portion is removed, and said separation layer under said transfer layer is exposed.

30. The method according to claim 18, wherein said separation start portion is a portion where said separation layer at said portion is exposed, and an outer peripheral edge of said separation layer is located inside said bonded substrate stack.

31. The method according to claim 13, wherein said separation layer is a porous layer.

32. The method according to claim 13, wherein said first substrate is a substrate formed by anodizing a substrate to form a porous layer as the separation layer and forming said transfer layer on said separation layer.

33. The method according to claim 13, wherein said first substrate has, as said separation layer, a porous layer formed by ion implantation.

34. The method according to claim 13, wherein said transfer layer includes a single-crystal Si layer.

35. The method according to claim 13, wherein said transfer layer sequentially has a single-crystal Si layer and an insulating layer as said transfer layer.

36. A method of manufacturing an SOI substrate, comprising:
the preparation step of bringing a surface of a first substrate having a porous layer inside and a transfer layer including a single-crystal Si layer on said porous layer into tight contact with a second substrate to prepare a bonded substrate stack having a projecting portion at which an outer peripheral edge of said first substrate projects outside that of said second substrate;
the separation step for starting separating said bonded substrate stack from said projecting portion and separating said bonded substrate stack at said porous layer, thereby transferring said transfer layer of said first substrate to said second substrate; and
the removal step of removing said porous layer remaining on a surface of said second substrate after separation.

37. The method according to claim 36, wherein said first substrate has, as said transfer layer, not only said single-crystal Si layer but also an insulating layer on said single-crystal Si layer.

38. The method according to claim 36, wherein said second substrate has an insulating layer on a surface.

39. The method according to claim 36, wherein the preparation step comprises bringing said first substrate and said second substrate, which have the same size, into tight contact with each other while shifting central positions to prepare said bonded substrate stack.

40. The method according to claim 36, wherein the preparation step comprises bringing said first substrate into tight contact with said second substrate smaller than said first substrate to prepare said bonded substrate stack.

41. The method according to claim 40, wherein the preparation step comprises bringing said first substrate into tight contact with said second substrate while making the central positions match with each other.

42. The method according to claim 36, wherein the preparation step comprises bringing said first substrate into tight contact with said second substrate having one of an orientation flat and a notch to prepare said bonded substrate stack having, as said projecting portion, a portion where said first substrate is exposed in the presence of the orientation flat or notch of said second substrate.

43. The method according to claim 36, wherein the preparation step comprises preparing said first substrate and said second substrate each having one of an orientation flat and a notch, and bringing said first substrate and said second substrate into tight contact with each other without matching the orientation flat or notch of said first substrate with the orientation flat or notch of said second substrate to prepare said bonded substrate stack.

44. The method according to claim 36, wherein the separation step comprises:

the pre-separation step of processing said projecting portion to form a separation start portion; and starting separating said bonded substrate stack from said separation start portion and then breaking substantially only said porous layer to separate said bonded substrate stack into two substrates at said porous layer.

45. The method according to claim 44, wherein the pre-separation step comprises ejecting a fluid to said projecting portion to form said separation start portion by the fluid.

46. The method according to claim 44, wherein the pre-separation step comprises inserting a wedge-shaped member into a gap between said first substrate and said second substrate at said projecting portion to form said separation start portion.

47. The method according to claim 44, wherein the pre-separation step comprises supplying a vibration energy to said projecting portion to form said separation start portion.

48. The method according to claim 44, wherein the pre-separation step comprises dipping said projecting portion in a liquid and supplying a vibration energy to said projecting portion through the liquid to form said separation start portion.

49. The method according to claim 48, wherein water is used as the liquid.

50. The method according to claim 48, wherein an etchant is used as the liquid.

51. The method according to claim 44, wherein the pre-separation step comprises etching said transfer layer and said porous layer at said projecting portion to form said separation start portion.

52. The method according to claim 36, wherein the separation step comprises ejecting a fluid to said projecting portion to form said separation start portion on said bonded substrate stack and continuing separating said bonded substrate stack while changing a position where the fluid is injected.

53. The method according to claim 36, wherein the separation step comprises inserting a wedge-shaped member into a gap between said first substrate and said second substrate at said projecting portion to separate said bonded substrate stack.

54. The method according to claim 36, wherein said separation start portion is a portion where said porous layer at said portion has the most fragile structure.

55. The method according to claim 36, wherein said separation start portion is a portion where said transfer layer at said portion is removed, and said porous layer under said transfer layer is exposed.

56. The method according to claim 36, wherein said separation start portion is a portion where said porous layer at said portion is exposed, and an outer peripheral edge of said porous layer is located inside said bonded substrate stack.

* * * * *

UNITED STATES PATENT AND TRADEMARK OFFICE
CERTIFICATE OF CORRECTION

PATENT NO.    : 6,376,332 B1
DATED         : April 23, 2002
INVENTOR(S)   : Yanagita et al.

It is certified that error appears in the above-identified patent and that said Letters Patent is hereby corrected as shown below:

Column 20,
Line 65, "shown, in" should read -- shown in --

Column 23,
Line 6, "process time:" should read -- Process time: --

Column 24,
Line 1, "kgf/cm" should read -- $kgf/cm^2$ --

Signed and Sealed this

Twenty-fourth Day of September, 2002

Attest:

JAMES E. ROGAN
Attesting Officer           Director of the United States Patent and Trademark Office